US011189762B2

United States Patent
Liu

(10) Patent No.: US 11,189,762 B2
(45) Date of Patent: Nov. 30, 2021

(54) SELF-EMISSIVE ELEMENT AND MANUFACTURING METHOD OF LIGHT EMITTING APPARATUS

(71) Applicant: Au Optronics Corporation, Hsinchu (TW)

(72) Inventor: Chung-Chan Liu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 84 days.

(21) Appl. No.: 16/662,005

(22) Filed: Oct. 23, 2019

(65) Prior Publication Data

US 2020/0381600 A1     Dec. 3, 2020

(30) Foreign Application Priority Data

May 28, 2019   (TW) .................................. 108118428

(51) Int. Cl.
*H01L 33/54*   (2010.01)
*H01L 33/38*   (2010.01)
(Continued)

(52) U.S. Cl.
CPC ............ *H01L 33/54* (2013.01); *H01L 27/153* (2013.01); *H01L 33/387* (2013.01); *H01L 33/62* (2013.01);
(Continued)

(58) Field of Classification Search
CPC .......... H01L 33/02; H01L 33/20; H01L 33/36; H01L 33/38–387; H01L 33/44; H01L 33/48–486; H01L 33/52; H01L 33/54–60; H01L 27/15; H01L 27/153; H01L 27/156
See application file for complete search history.

(56) References Cited

U.S. PATENT DOCUMENTS

| | | | |
|---|---|---|---|
| 6,614,058 B2 * | 9/2003 | Lin ........................ | H01L 33/486 257/100 |
| 7,476,913 B2 * | 1/2009 | Isobe ................ | B29C 45/14655 257/98 |

(Continued)

FOREIGN PATENT DOCUMENTS

| CN | 106058001 | 10/2016 |
|---|---|---|
| CN | 106816408 | 6/2017 |

(Continued)

*Primary Examiner* — Maliheh Malek
(74) *Attorney, Agent, or Firm* — JCIPRNET

(57) ABSTRACT

A self-emissive element includes a light-emitting diode (LED) and an auxiliary structure. The LED includes a first type semiconductor, a second type semiconductor, a first pad, and a second pad. The second type semiconductor is overlapped with the first type semiconductor in a vertical direction perpendicular. The auxiliary structure includes a cover portion, a protection portion and a first anchor portion. The cover portion is overlapped with the LED in the vertical direction. The protection portion is not overlapped with the LED in the vertical direction. An orthographic projection area of the protection portion in the vertical direction is greater than or equal to an orthographic projection area of the LED in the vertical direction. The first anchor portion and the protection portion are respectively located at different sides of the LED.

26 Claims, 34 Drawing Sheets

(51) Int. Cl.
   *H01L 33/62* (2010.01)
   *H01L 33/00* (2010.01)
   *H01L 27/15* (2006.01)

(52) U.S. Cl.
   CPC .... *H01L 33/0093* (2020.05); *H01L 2933/005* (2013.01); *H01L 2933/0016* (2013.01); *H01L 2933/0033* (2013.01); *H01L 2933/0066* (2013.01)

(56) References Cited

U.S. PATENT DOCUMENTS

| | | | |
|---|---|---|---|
| 8,865,489 B2 | 10/2014 | Rogers et al. | |
| 9,997,501 B2 | 6/2018 | Bower et al. | |
| 10,310,327 B2* | 6/2019 | Liu | G02F 1/133611 |
| 10,424,500 B2 | 9/2019 | Chang et al. | |
| 10,867,971 B2* | 12/2020 | Liu | H01L 24/10 |
| 10,876,692 B2* | 12/2020 | Sang | F21K 9/90 |
| 10,944,034 B2* | 3/2021 | Kuo | H01L 33/22 |
| 10,971,058 B1* | 4/2021 | Cheng | G09G 3/32 |
| 2006/0163589 A1* | 7/2006 | Fan | H01L 27/153 257/88 |
| 2006/0276096 A1* | 12/2006 | Wang | H01L 51/0024 445/2 |
| 2007/0058059 A1* | 3/2007 | Suehiro | H01L 33/56 348/294 |
| 2008/0128724 A1* | 6/2008 | Isobe | H01L 33/62 257/98 |
| 2008/0191222 A1* | 8/2008 | Lee | H01L 27/153 257/91 |
| 2013/0313591 A1* | 11/2013 | Shimada | H01L 23/3171 257/98 |
| 2014/0367633 A1 | 12/2014 | Bibl et al. | |
| 2016/0064604 A1* | 3/2016 | Lin | H01L 33/502 257/98 |
| 2016/0190105 A1* | 6/2016 | Rhee | H01L 25/0753 257/76 |
| 2016/0300745 A1 | 10/2016 | Chang et al. | |
| 2017/0025399 A1* | 1/2017 | Takeya | H05B 33/12 |
| 2017/0062674 A1* | 3/2017 | Kwon | H01L 33/58 |
| 2017/0125641 A1* | 5/2017 | Jeon | H01L 33/32 |
| 2017/0358624 A1* | 12/2017 | Takeya | H01L 25/167 |
| 2018/0151804 A1* | 5/2018 | Chaji | H01L 27/326 |
| 2018/0277524 A1* | 9/2018 | Moon | H01L 33/22 |
| 2018/0277589 A1* | 9/2018 | Chang | H01L 33/025 |
| 2018/0340985 A1* | 11/2018 | Jung | G01J 3/505 |
| 2019/0229097 A1* | 7/2019 | Takeya | H01L 33/0093 |
| 2020/0035748 A1* | 1/2020 | Xia | H01L 33/32 |
| 2020/0066954 A1* | 2/2020 | Kuo | H01L 33/38 |
| 2020/0166183 A1* | 5/2020 | Sang | H01L 33/44 |
| 2020/0194406 A1* | 6/2020 | Liu | H01L 24/10 |
| 2020/0235076 A1* | 7/2020 | Batres | H01L 25/0753 |
| 2020/0318815 A1* | 10/2020 | Chen | H01L 33/0012 |
| 2020/0365648 A1* | 11/2020 | Jang | H01L 33/08 |
| 2020/0381410 A1* | 12/2020 | Yueh | H01L 27/14621 |
| 2020/0388601 A1* | 12/2020 | Liu | H01L 25/167 |
| 2021/0013388 A1* | 1/2021 | Zhong | H01L 33/36 |
| 2021/0111313 A1* | 4/2021 | Wang | H01L 21/0228 |
| 2021/0111325 A1* | 4/2021 | Kim | H01L 24/83 |
| 2021/0151423 A1* | 5/2021 | Zhang | H01L 25/50 |

FOREIGN PATENT DOCUMENTS

| | | |
|---|---|---|
| CN | 107833526 | 3/2018 |
| TW | 201806197 | 2/2018 |
| TW | 201817036 | 5/2018 |

* cited by examiner

SELF-EMISSIVE ELEMENT AND MANUFACTURING METHOD OF LIGHT EMITTING APPARATUS

CROSS-REFERENCE TO RELATED APPLICATION

This application claims the priority benefit of Taiwan application serial no. 108118428, filed on May 28, 2019. The entirety of the above-mentioned patent application is hereby incorporated by reference herein and made a part of this specification.

BACKGROUND OF THE INVENTION

Field of the Invention

The present invention is related to a self-emissive element including an auxiliary structure and a light-emitting diode, and more particularly to a self-emissive element and a manufacturing method of a light emitting apparatus.

Description of Related Art

A Light Emitting Diode (LED) is a kind of light-emitting element, which is suitable for constructing pixel structures of a micro-LEDs display panel because of its low power consumption, high brightness, high resolution, and high color saturation.

A technique of transporting LEDs onto a driving backplane having a pixel circuit is called mass transfer. However, in the prior art, when the LEDs are transferred, defects of the micro-LEDs display panel may be easily caused by the yield of grain and many other factors, and some sub-pixels in the light-emitting device cannot be operated normally. Therefore, a complicated and time-consuming repair process for the light-emitting device is required to repair the sub-pixels that are not functioning properly.

SUMMARY OF THE INVENTION

The invention provides a self-emissive element which can reduce the time and material cost required to repair a light-emitting device.

The invention provides a manufacturing method of a light-emitting device which can reduce the time and material cost required for repairing the light-emitting device.

An embodiment of the invention provides a self-emissive element includes a light emitting diode (LED) and an auxiliary structure. The LED includes a first type semiconductor, a second type semiconductor, an active layer, a first pad, and a second pad. The second type semiconductor is overlapped with the first type semiconductor in a vertical direction perpendicular to the bottom surface of the first type semiconductor. The active layer is disposed between the first type semiconductor and the second type semiconductor. The first pad is connected with the first type semiconductor. The second pad is connected with the second type semiconductor. The auxiliary structure includes a cover portion, a protection portion and a first anchor portion. The cover portion is overlapped with the LED in the vertical direction. The protection portion is not overlapped with the LED in the vertical direction. An orthographic projection area of the protection portion in the vertical direction is greater than or equal to an orthographic projection area of the LED in the vertical direction. The first anchor portion and the protecting portion are respectively located on different sides of the LED.

An embodiment of the invention provides a manufacturing method of a light-emitting device including following steps. A pixel circuit substrate is provided, wherein the pixel circuit substrate comprises a plurality of driving structures, and each of the driving structures includes a first electrode and a second electrode. A first transposition process is performed to provide a first light-emitting element on one of the drive structures, wherein the first light-emitting element is a self-emissive element as described above. The first pad of the first light-emitting element and the first electrode of the one of the driving structures are electrically connected. The second pad of the first light-emitting element and the second electrode of the one of the driving structures are electrically connected. A second transposition process is performed to provide a second light-emitting element on another of the drive structures, wherein the second light-emitting is a self-emissive element as previously described.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
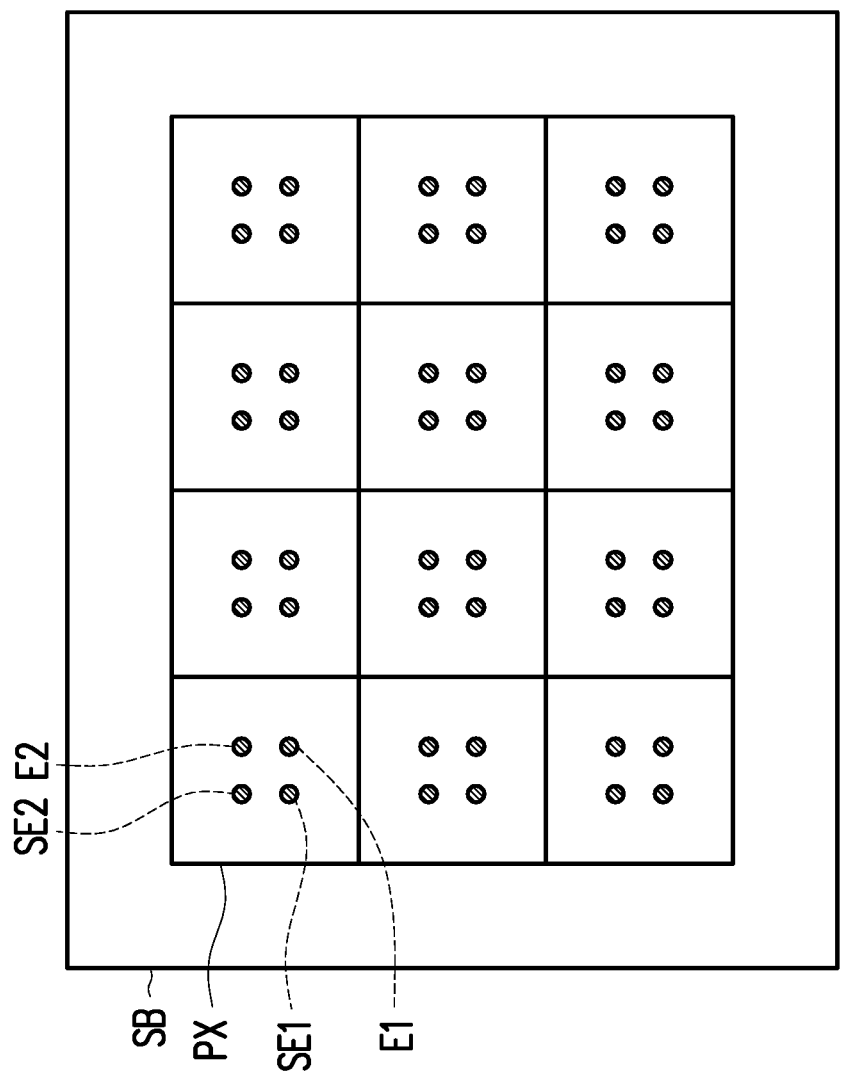
FIGS. 1A to 1C are schematic top views of a manufacturing method of a light emitting device in accordance with an embodiment of the present invention.

In the accompanying drawings, thicknesses of layers, films, panels, regions and so on are exaggerated for clarity. Throughout the specification, the same reference numerals in the accompanying drawings denote the same or similar elements. It should be understood that when an element such as a layer, film, region or substrate is referred to as being "on" or "connected to" another element, it can be directly on or connected to the other element, or intervening elements may also be present between said element and said another element. In contrast, when an element is referred to as being "directly on" or "directly connected to" another element, there are no intervening elements present between said element and said another element. As used herein, the term "connected" may refer to physically connected and/or electrically connected. Therefore, intervening elements may be present between two elements when the two elements are "electrically connected" or "coupled" to each other.

The term "approximately" or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "approximately" may mean within one or more standard deviations, or within, for example, ±30%, ±20%, ±15%, ±10%, ±5% of the stated value. Moreover, a relatively acceptable range of deviation or standard deviation may be chosen for the term "approximately" or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 1B:
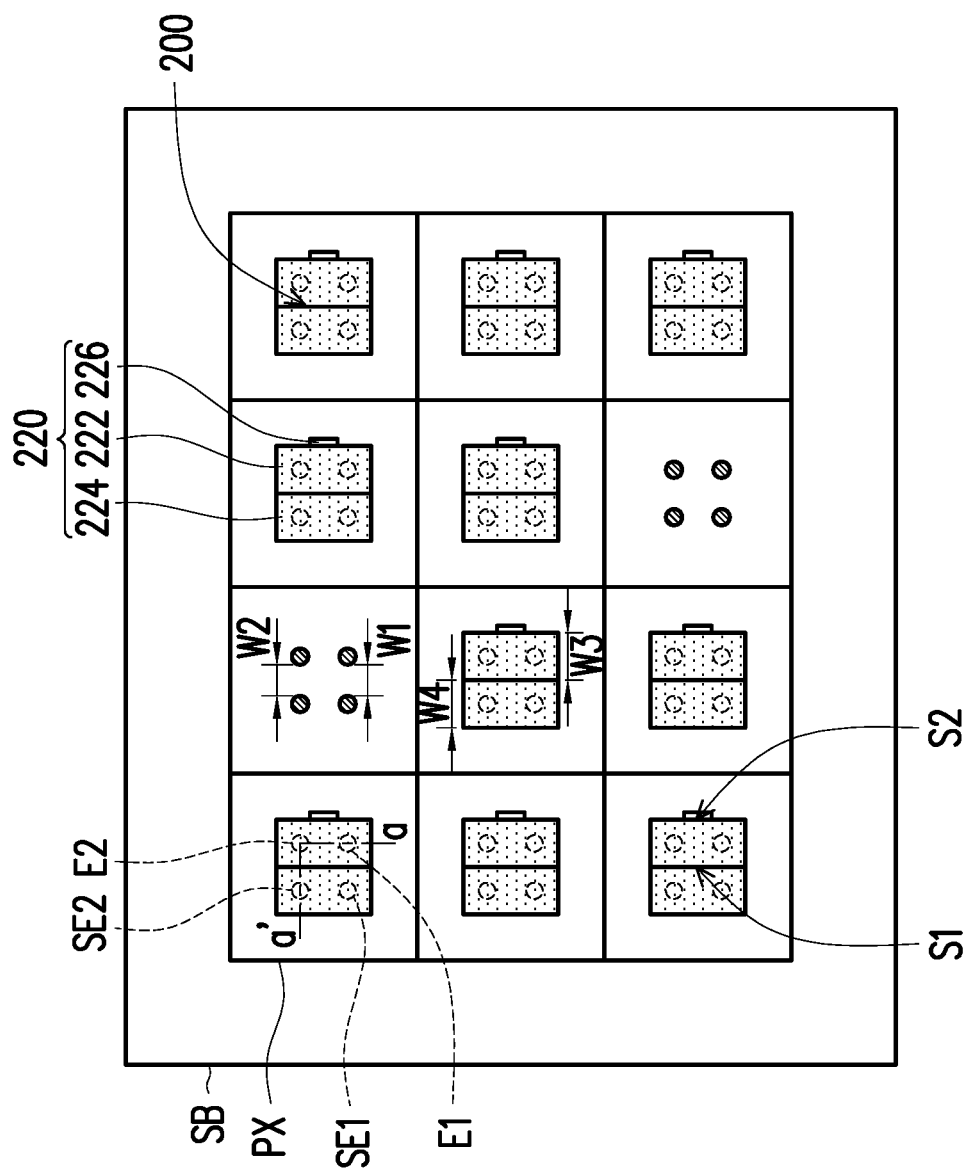
Figure 1C:
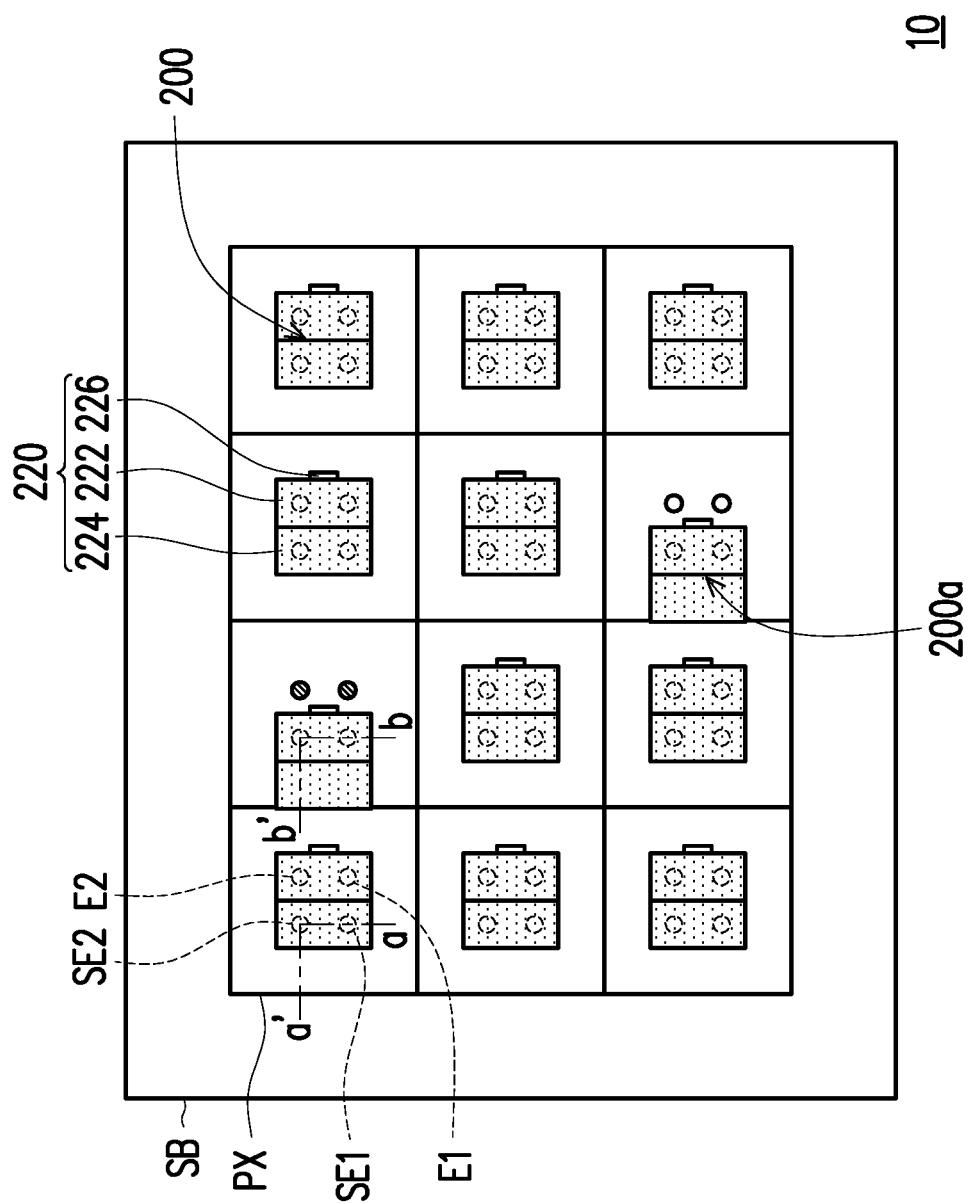
Figure 2A:
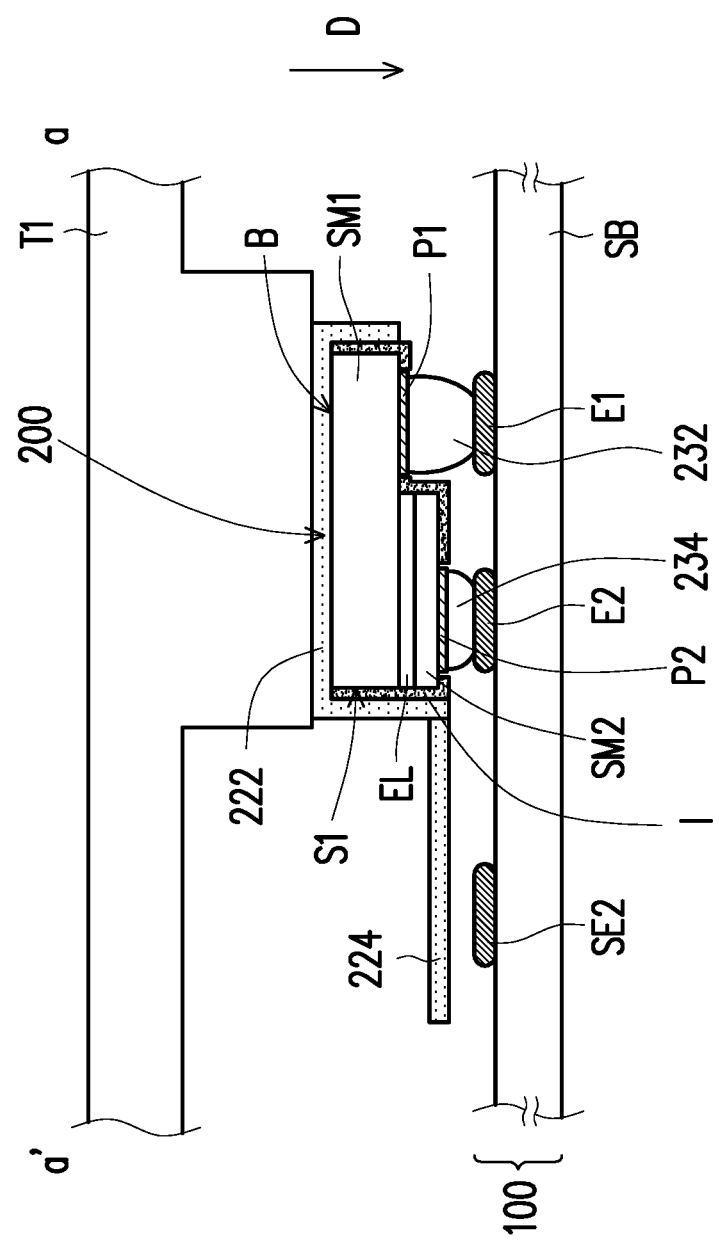
FIG. 2A is a schematic cross-sectional view taken along line aa' of FIG. 1B.
Figure 2B:
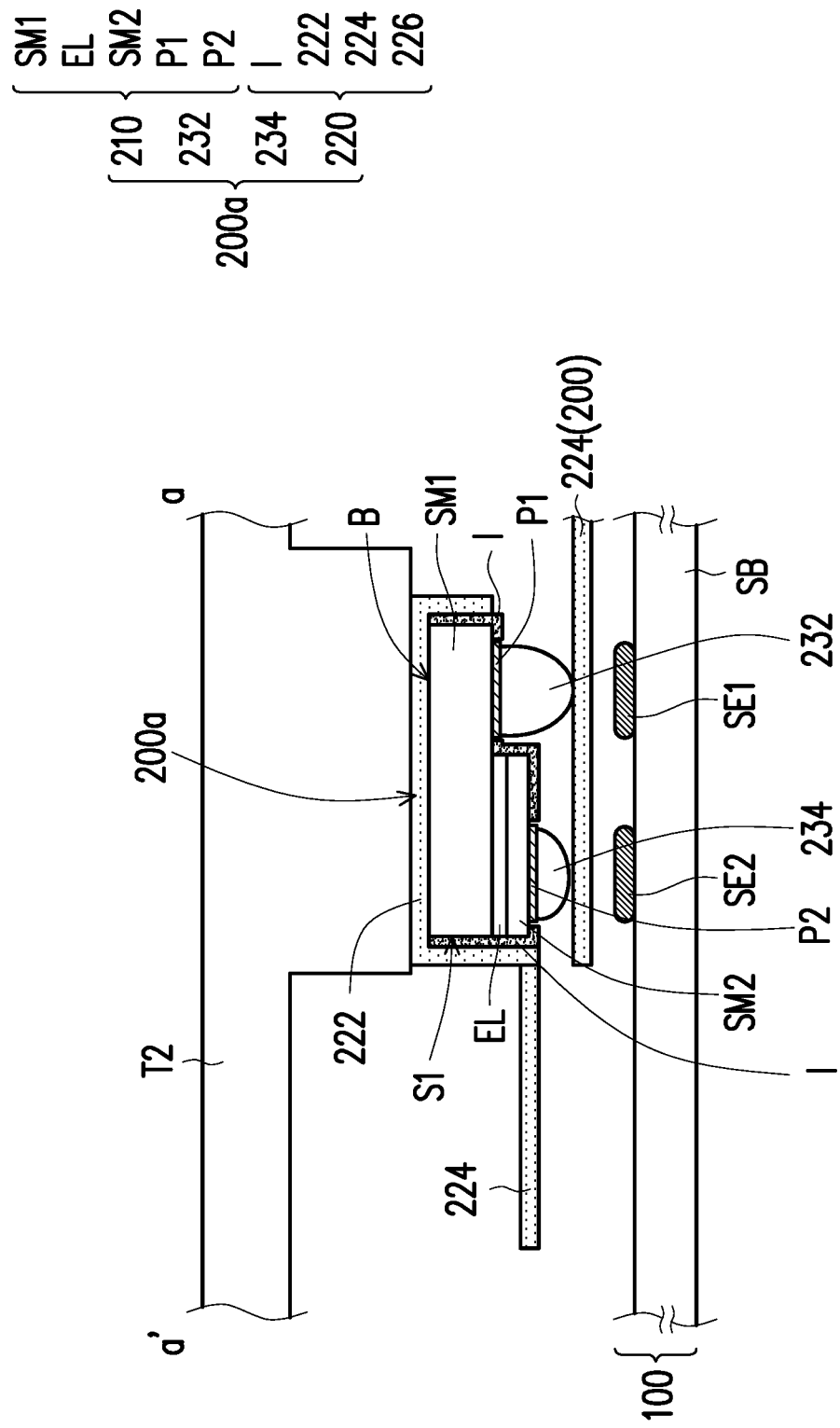
FIG. 2B is a schematic cross-sectional view taken along line aa' of FIG. 1C.
Figure 2C:
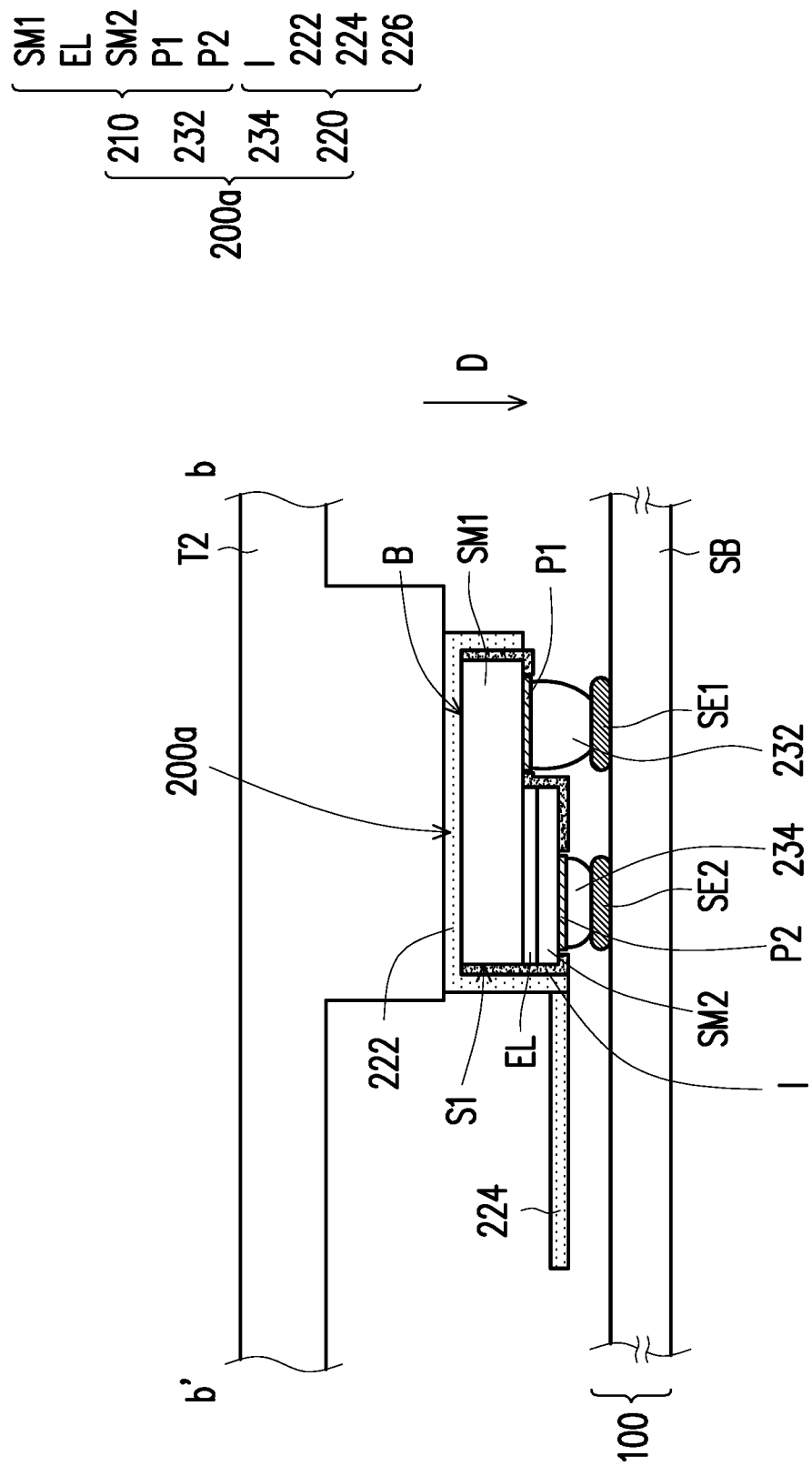
FIG. 2C is a schematic cross-sectional view taken along line bb' of FIG. 1C.

FIGS. 1A to 1C are schematic top views of a manufacturing method of a light emitting device in accordance with an embodiment of the present invention. FIG. 2A is a schematic cross-sectional view taken along line aa' of FIG. 1B. FIG. 2B is a schematic cross-sectional view taken along line aa' of FIG. 1C. FIG. 2C is a schematic cross-sectional view taken along line bb' of FIG. 1C. For convenience of description, FIGS. 1A to 1C omits some of the components in FIGS. 2A to 2C.

Referring to FIG. 1A, a pixel circuit substrate 100 is provided. The pixel circuit substrate 100 includes a substrate SB and a plurality of driving structures PX on the substrate SB. Each of the driving structures PX includes a first electrode E1 and a second electrode E2. In the embodiment, the pixel circuit substrate 100 further includes a first auxiliary electrode SE1 and a second auxiliary electrode SE2. The first auxiliary electrode SE1 is electrically connected to the first electrode E1. The first auxiliary electrode SE1 is structurally separated from the first electrode E1 but has the same electric potential with the first electrode E1. The second auxiliary electrode SE2 is electrically connected to the second electrode E2. The second auxiliary electrode SE2 is structurally separated from the second electrode E2 but has the same electric potential with the second electrode E2. Although only twelve drive structures PX are depicted in FIG. 1A, the invention is not limited thereto. The number of drive structures PX can be determined according to actual needs.

The materials of the first electrode E1, the second electrode E2, the first auxiliary electrode SE1, and the second auxiliary electrode SE2 include metals (eg, chromium, gold, silver, copper, tin, lead, hafnium, tungsten, molybdenum, neodymium, titanium, tantalum, aluminum, zinc or alloys of the above metals), metal oxides (such as indium tin oxide) or other conductive materials.

Referring to FIG. 1B and FIG. 2A, a first transposition process is performed to provide the first light emitting element 200 on one of the driving structures PX. For convenience of explanation, the transposition device T1 is omitted from FIG. 1B.

In the present embodiment, the first transposition process is, for example, a massive transfer, and a first transposition process is performed to provide a plurality of first light-emitting elements 200 on the plurality of drive structures PX. The first transposition process is, for example, transferring the first light-emitting element 200 by the transposition device T1. The method of picking up the first light-emitting element 200 by the transposition device T1 is, for example, electrostatic adsorption, vacuum adsorption, van der Wafer adsorption or the like, but the invention is not limited thereto. After performing the first transposition process, the transposition device T1 is removed.

In the present embodiment, the first light emitting element 200 is a self-emissive element, and includes a light emitting diode 210 and an auxiliary structure 220. The light emitting diode 210 includes a first type semiconductor SM1, a second type semiconductor SM2, a first pad P1, and a second pad P2. In the embodiment, the first light emitting element 200 further includes a first connection structure 232 and a second connection structure 234, and the light emitting diode 210 further includes an active layer EL.

The second type semiconductor SM2 overlaps the first type semiconductor SM1 along the vertical direction D of the bottom surface B of the first type semiconductor SM1.

In the present embodiment, the second type semiconductor SM2, the active layer EL, and the first type semiconductor SM1 are sequentially stacked. The active layer EL is disposed between the first type semiconductor layer SM1 and the second type semiconductor layer SM2.

One of the first type semiconductor SM1 and the second type semiconductor SM2 is an N type doped semiconductor, and the other is a P type doped semiconductor. Materials of the first type semiconductor SM1 and the second type semiconductor SM2 include, for example, gallium nitride (GaN), indium gallium nitride (InGaN), gallium arsenide (GaAs), or other materials consisting of group IIIA and VA elements or other suitable materials, but the invention is not limited thereto. The active layer EL has, for example, a Quantum Well (QW) such as a single quantum well (SQW), a multiple quantum well (MQW) or other quantum well. The holes provided by the P-doped semiconductor layer and the electrons provided by the N-doped semiconductor layer can be combined in the active layer EL and release energy in a mode of light. In some embodiments, the material of the active layer EL includes, for example, gallium nitride (GaN), indium gallium nitride (InGaN), gallium arsenide (GaAs), aluminum gallium indium phosphide (AlGaInP), indium aluminum gallium arsenide (InAlGaAs) or other materials consisting of Group IIIA and VA elements or other suitable materials.

The auxiliary structure 220 includes a cover portion 222, a protection portion 224, and a first anchor portion 226. The material of the auxiliary structure 220 includes a dielectric material (e.g. silicon nitride, silicon oxide or other dielectric material), a semiconductor material, a conductor material, or a stack of any two of the above. In the present embodiment, the auxiliary structure 220 further includes an insulating layer 1.

The insulating layer I covers the second type semiconductor SM2, the active layer EL, and the first type semiconductor SM1, and exposes a part of the second type semiconductor SM2 and a part of the first type semiconductor SM1. The first pad P1 is in connect with the first type semiconductor SM1. The second pad P2 is in connect with the second type semiconductor SM2. The first pad P1 and the second pad P2 include a conductive material. In this embodiment, the light emitting diode 210 are horizontal light emitting diode, and the first pads P1 and the second pads P2 are located on the same side of the light emitting diode 210.

The cover portion 222 overlaps the light emitting diode 210 in the vertical direction D. For example, the cover portion 222 overlaps the bottom surface B of the first type semiconductor SM1 in the vertical direction D. In the present embodiment, the cover portion 222 covers the bottom surface B and the side surfaces (including the first side S1 and the second side S2) of the first type semiconductor SM1.

The protection portion 224 does not overlap the light emitting diode 210 in the vertical direction D. For example, the protection portion 224 is located at the first side S1 of the light emitting diode 210, and the protection portion 224 extends outward from the first side S1 of the light emitting diode 210. The orthographic projection area of the protection portion 224 in the vertical direction D is greater than or equal to the orthographic projection area of the light-emitting diode 210 in the vertical direction D.

The first anchor portion 226 and the protection portion 224 are respectively located on different sides of the light emitting diode 210. For example, the first anchor portion 226 is located on the second side S2 of the light emitting diode 210, and the first anchor portion 226 extends outward from the second side S2 of the light emitting diode 210. Before the first light-emitting element 200 is transferred by mass transfer, the first light-emitting element 200 is in connect with an intermediary substrate or a growth substrate. When the first light emitting element 200 is picked up from the intermediary substrate or the growth substrate, the joint between the first light emitting element 200 and the intermediary substrate or the growth substrate is broken, and the first anchor portion 226 is formed. In the present embodiment, the orthographic projection area of the first anchor portion 226 in the vertical direction D is smaller than the orthographic projection area of the protection portion 224 in the vertical direction D.

The first connection structure 232 and the second connection structure 234 are respectively located on the first pad P1 and the second pad P2. The first connection structure 232 and the second connection structure 234 are, for example, solder.

In this embodiment, after the first transposition process is performed, the first pad P1 of the first light emitting element 200 and the first electrode E1 of the driving structure PX are electrically connected. After the first transposition process is performed, the second pad P2 of the first light emitting element 200 and the second electrode E2 of the driving structure PX are electrically connected.

The first pad P1 of the first light emitting element 200 and the second pad P2 of the first light emitting element 200 face the pixel circuit substrate 100. In the present embodiment, a method of electrically connecting the first pads P1 of the first light emitting element 200 with the first electrode E1 and a method of electrically connecting the second pads P2 of the first light emitting element 200 with the second electrode E2 are, for example, eutectic bonding or other similar methods are included, but the invention is not limited thereto.

The protection portion 224 of the first light-emitting element 200 overlaps the first auxiliary electrode SE1 of the driving structure PX and the second auxiliary electrode SE2 of the driving structure PX. In some embodiments, the spacing W1 between the first electrode E1 and the first auxiliary electrode SE1 and the spacing W2 between the second electrode E2 and the second auxiliary electrode SE2 are greater than the width W3 of the light emitting diode 210.

The spacing W1 and the spacing W2 are smaller than the width W4 of the protection portion 224. Therefore, the protection portion 224 may easily cover the first auxiliary electrode SE1 and the second auxiliary electrode SE2, but the invention is not limited thereto.

In this embodiment, after the first transposition process is performed, the first light emitting elements 200 are not successfully disposed on a portion of the driving structure PX.

For example, the first transposition process moves a plurality of (eg, twelve) first light emitting elements 200 at one time, however, two of the first light emitting elements 200 fall during the transposition process, resulting in the first light emitting elements 200 are not disposed on two of the driving structures PX.

Referring to FIG. 1C, FIG. 2B and FIG. 2C, a second transposition process is performed to provide the second light emitting element 200a on another driving structure PX (the driving structure PX of the first light emitting elements 200 are not successfully disposed). For convenience of explanation, FIG. 1C omits the transposition device T2 and the second light emitting elements 200a that are not connected to the pixel circuit substrate 100.

In the present embodiment, the second transposition process is, for example, a massive transfer. The second transposition process is performed to provide a plurality of second light emitting elements 200a on the plurality of driving structures PX. For example, the second transposition process moves a plurality (eg, twelve) of second light emitting elements 200a at one time. The second transposition process is, for example, moving the second light emitting elements 200a by the transposition device T2, and the method of picking up the second light emitting elements 200a by the transposition device T2 is, for example, electrostatic adsorption, vacuum adsorption, van der Waals adsorption or the like. After the second transposition process is performed, the transposition device T2 is removed.

In the present embodiment, the second light emitting element 200a is a self-emissive element, and includes a light emitting diode 210 and an auxiliary structure 220. The light emitting diode 210 includes a first type semiconductor SM1, a second type semiconductor SM2, a first pad P1, and a second pad P2. In the embodiment, the second light emitting element 200a further includes a first connection structure 232 and a second connection structure 234, and the light emitting diode 210 further includes an active layer EL. The second light emitting element 200a has a similar structure to the first light emitting element 200, and therefore, details are not described herein.

The position of the second transposition process corresponding to the pixel circuit substrate 100 is deviating from the position of the first transposition process corresponding to the pixel circuit substrate 100. In the embodiment, the first connecting structure 232 and the second connecting structure 234 of the first light emitting element 200 respectively contact the first electrode E1 and the second electrode E2 of the pixel circuit substrate 100 by the first transposition process. The first connection structure 232 and the second connection structure 234 of the second light emitting element 200a respectively contact the first auxiliary electrode SE1 and the second auxiliary electrode SE2 of the pixel circuit substrate 100 the second transposition process.

Referring to FIG. 2B, on the driving structure PX in which the first light emitting element 200 is successfully disposed, the second light emitting element 200a is isolated by the protective layer 224 of the first light emitting element 200, so that the second light emitting element 200a is A connection structure 232 and a second connection structure 234 may be not in contact with the first auxiliary electrode SE1 and the second auxiliary electrode SE2 of the pixel circuit substrate 100.

Referring to FIG. 2C, the first connection structure 232 and the second connection structure 234 of the second light-emitting element 200a respectively contact the pixel circuit substrate 100 on the driving structure PX in which the first light-emitting element 200 is not successfully disposed. The first auxiliary electrode SE1 and the second auxiliary electrode SE2.

In this embodiment, after the second transposition process is performed, the first pad P1 of the second illuminating element 200a and the first auxiliary electrode SE1 of the driving structure PX are electrically connected. After the second transposition process is performed, the second pad P2 of the second illuminating element 200a and the second auxiliary electrode SE2 of the driving structure PX are electrically connected.

The first pad P1 of the second light emitting element 200a and the second pad P2 of the second light emitting element 200a face the pixel circuit substrate 100. In this embodiment, the method of electrically connecting the first pad P1 of the second light emitting element 200a with the first auxiliary electrode SE1 and electrically connecting the second pad P2 of the second light emitting element 200a with the second auxiliary electrode SE2 includes, for example, eutectic bonding or other similar methods, but the invention is not limited thereto.

Since the second light emitting element 200a can't be bonded to the first auxiliary electrode SE1 and the second auxiliary electrode SE2 of the pixel circuit substrate 100 on the driving structure PX on which the first light emitting element 200 is successfully disposed, the second light emitting elements 200a will not remain on the drive structures PX on which the first light emitting elements 200 are successfully disposed. The second light emitting elements 200a blocked by the protection portions 224 of the first light emitting elements 200 remain on the transposition device T2. Since the second light emitting element 200a remaining on the transposition device T2 can be used for the next transposition process, the material cost required to repair the light emitting device 10 can be reduced. Further, since the second transposition process can provide the second light emitting elements 200a on the drive structures PX in which the first light emitting elements 200 are not successfully disposed at one time, the time cost required for repairing the light emitting device 10 can be reduced.

In the present embodiment, the first auxiliary electrode SE1 of each of the driving structures PX has the same electric potential with the first electrode E1, and the second auxiliary electrode SE2 has the same electric potential with the second electrode E2. Therefore, the light emitting device 10 can be operated normally regardless of whether the first light emitting element 200 or the second light emitting element 200a is disposed on the driving structure PX.

Figure 3A:
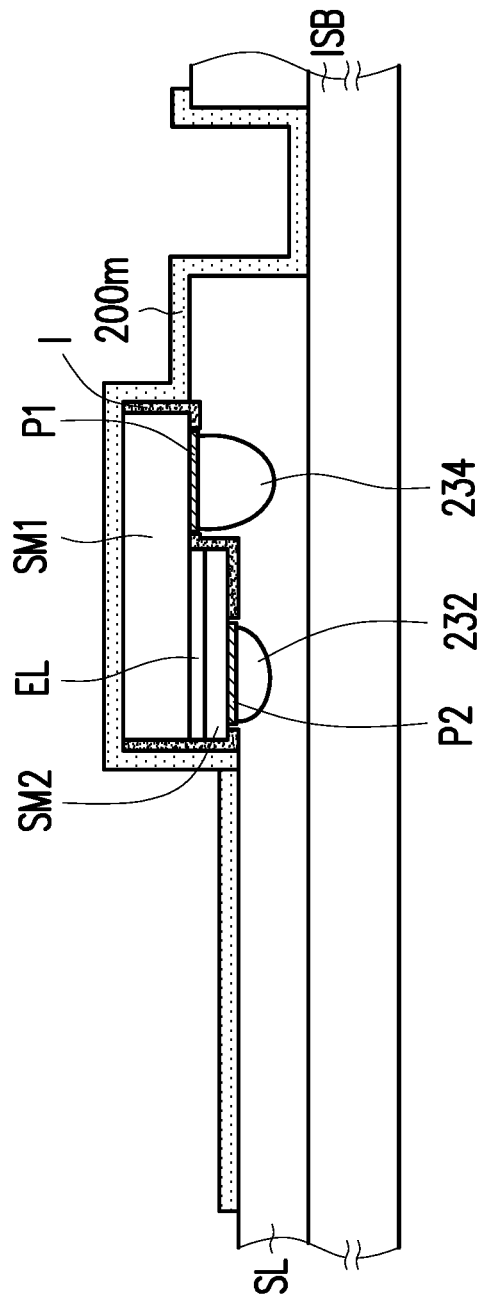
FIGS. 3A to 3C are schematic cross-sectional views showing a transposition device for picking up a first light emitting element according to an embodiment of the invention.
Figure 3B:
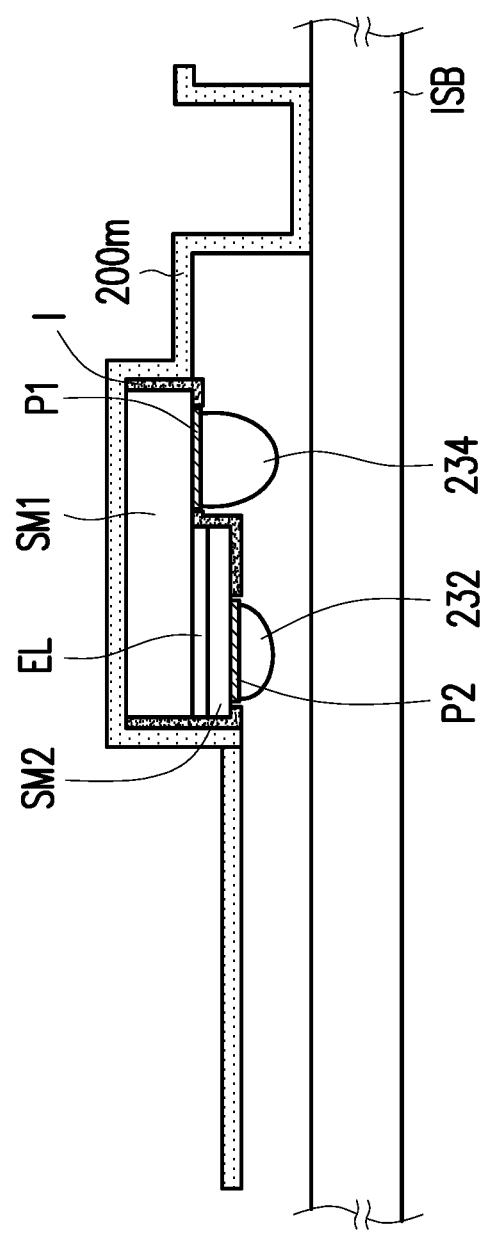
Figure 3C:
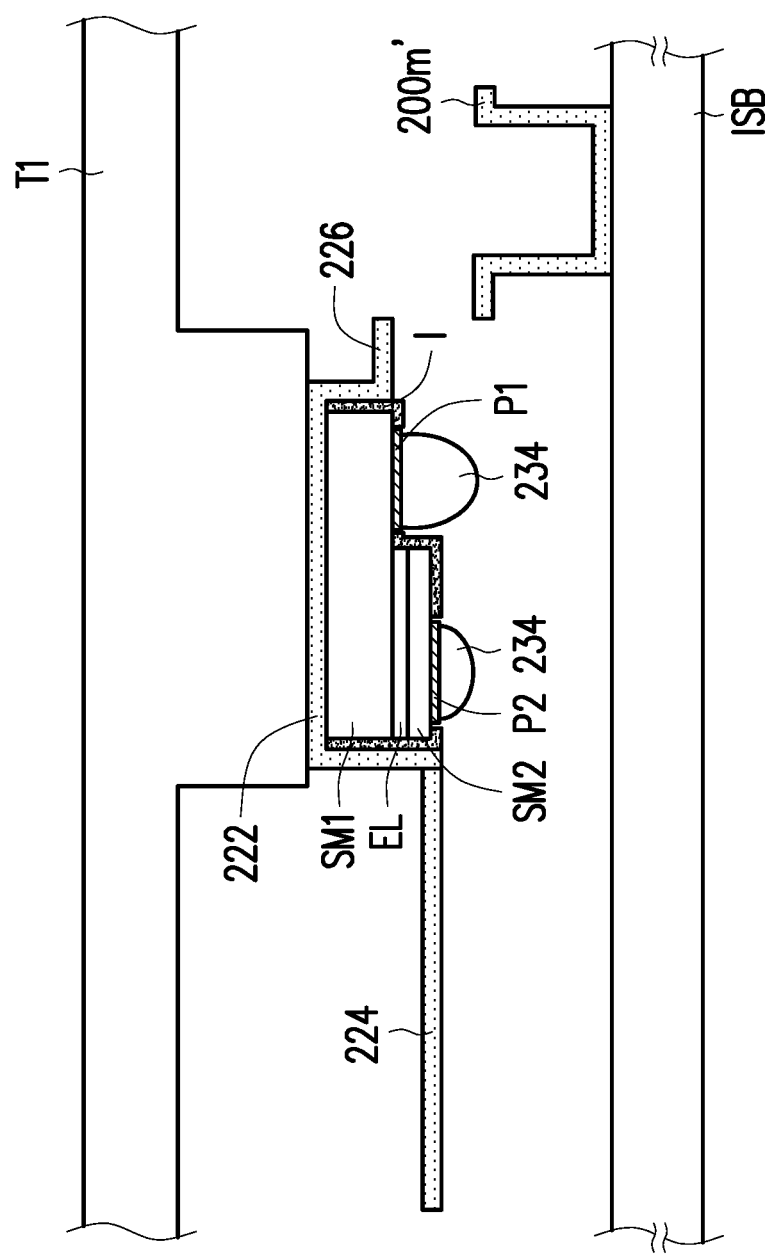

FIGS. 3A to 3C are schematic cross-sectional views of a transposition device for picking up a first light emitting element according to an embodiment of the invention.

Referring to FIG. 3A, the first light emitting element 200 and the intermediary substrate ISB are connected through the tether material 200m. In the present embodiment, the sacrificial layer SL is further provided between the tether material 200m and the intermediary substrate ISB, and the material of the sacrificial layer SL is, for example, a silicon substrate, an organic material, or other materials that are easily etched (wet etching or dry etching).

Referring to FIG. 3B, the sacrificial layer SL is removed. The sacrificial layer SL is removed, for example, by wet or dry etching.

Referring to FIG. 3C, the first light emitting element 200 is picked up by the transposition device T1. When the first light emitting element 200 is picked up from the intermediary substrate ISB, the connection (the tether material 200m) between the first light emitting element 200 and the intermediary substrate or the growth substrate is broken, and an auxiliary structure 220 including a cover portion 222, a protection portion 224, and a first anchor portion 226 is left on the first light emitting element 200. A part of the tether material 200 m' remains on the intermediary substrate ISB.

Although a structure of the sacrificial layer SL and the tether material 200m is illustrated in FIGS. 3A to 3C, the invention is not limited thereto. In other embodiments, the sacrificial layer SL and the tether material 200m may have other shapes such that the auxiliary structure 220 on the first emitting element 200 has other shapes.

The manner in which the second light emitting element 200a is picked up by the transposition device T2 is similar to the manner in which the first light emitting element 200 is picked up by the transposition device T1, and thus will not be described herein.

Figure 4:
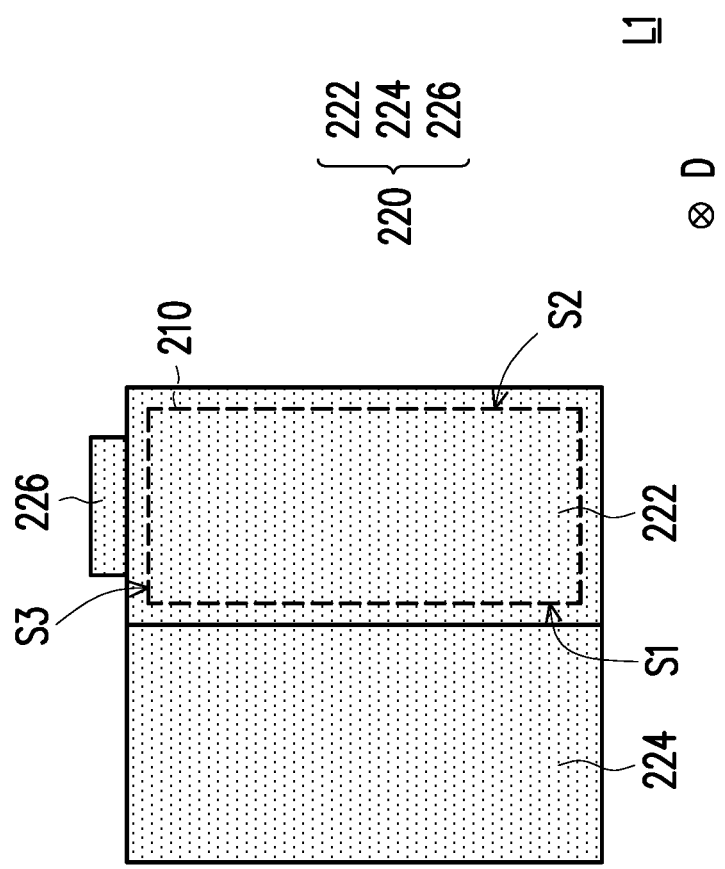
FIG. 4 is a schematic top view of a self-emissive element in accordance with an embodiment of the present invention.

FIG. 4 is a schematic top view of a self-emissive element in accordance with an embodiment of the present invention.

The structure of the self-emissive element L1 of FIG. 4 is, for example, similar to the first light-emitting element 200 and the second light-emitting element 200a of FIG. 2B. A difference between the embodiment of FIG. 2B and the embodiment of FIG. 4 is that the first anchor portion 226 of the self-emissive element L1 in FIG. 4 is located at the third side S3 of the light-emitting diode 210, wherein the third side S3 is connected with the first side S1 and the second side S2.

Figure 5:
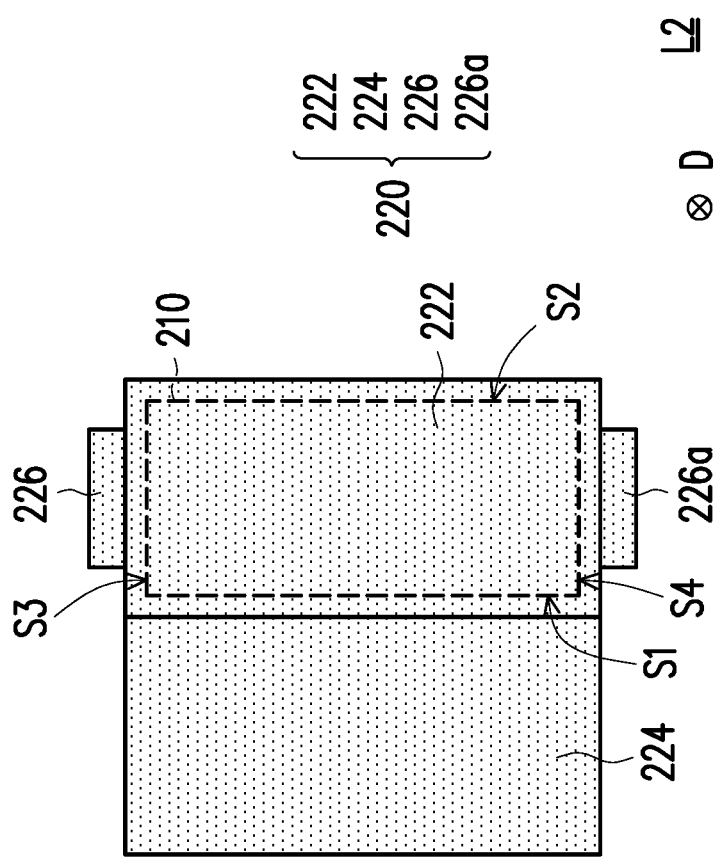
FIG. 5 is a schematic top view of a self-emissive element in accordance with an embodiment of the present invention.

FIG. 5 is a schematic top view of a self-emissive element in accordance with an embodiment of the invention.

The structure of the self-emissive element L2 of FIG. 5 is, for example, similar to the self-emissive element L1 of FIG. 4 except that the self-luminous element L2 further includes a second anchor portion 226a, and the second anchor portion 226a is located at the fourth side S4 of the light emitting diode 210, wherein the fourth side S4 is opposite to the third side S3.

In this embodiment, the first anchor portion 226 and the second anchor portion 226a are respectively located at different sides of the light emitting diode 210, and the second anchor portion 226a and the protection portion 224 are respectively located at different sides of the light emitting diode 210.

Figure 6:
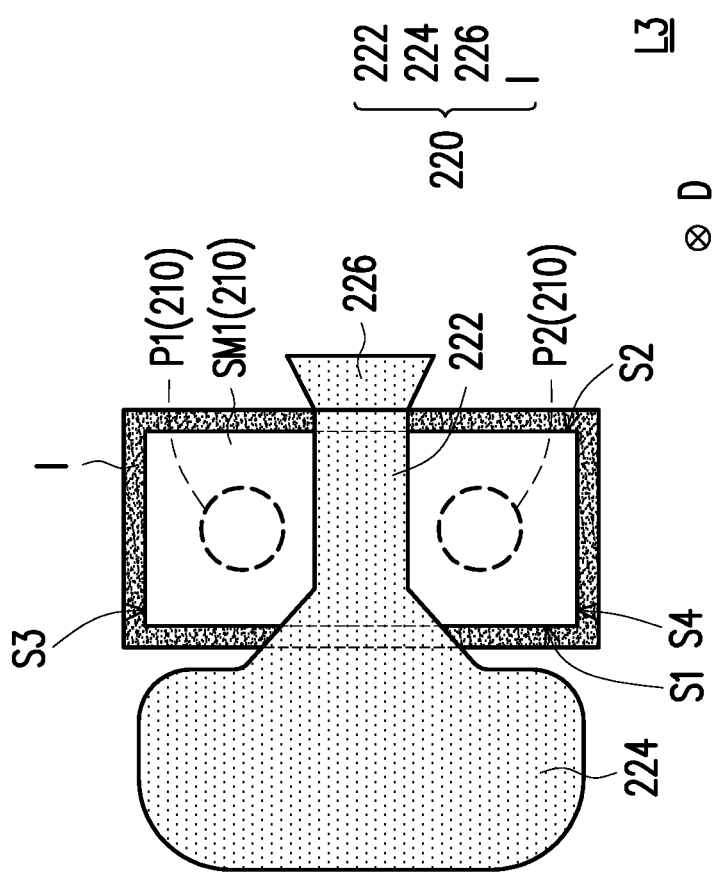
FIG. 6 is a schematic top view of a self-emissive element in accordance with an embodiment of the present invention.

FIG. 6 is a schematic top view of a self-emissive element in accordance with an embodiment of the present invention.

The structure of the self-emissive element L3 is, for example, similar to the first light-emitting element 200 and the second light-emitting element 200a in the foregoing embodiment except that the orthographic projection area of the cover portion 222 of the self-emissive element L3 in the vertical direction D is smaller than the orthographic projection area of the light emitting diode 210 in the vertical direction D.

Figure 7:
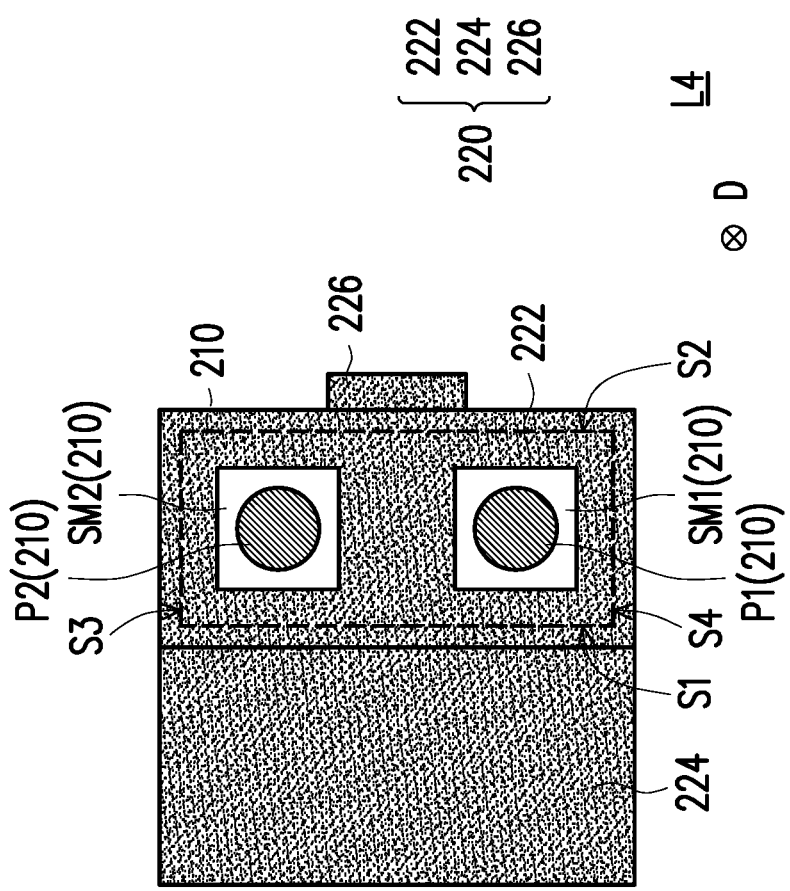
FIG. 7 is a schematic top view of a self-emissive element in accordance with an embodiment of the present invention.

FIG. 7 is a schematic top view of a self-emissive element in accordance with an embodiment of the present invention.

The structure of the self-luminous element L4 of FIG. 7 is, for example, similar to the first light-emitting element 200 and the second light-emitting element 200a of FIG. 2B, except that the self-emissive element L4 does not have the insulating layer I.

The auxiliary structure 220 includes a cover portion 222, a protection portion 224, and a first anchor portion 226. The cover portion 222 of the auxiliary structure 220 of the self-emissive element L4 is formed on the first type semiconductor SM1, the active layer EL, and the second type semiconductor SM2, and the cover portion 222 has openings exposing the first type semiconductor SM1 and the second type semiconductor SM2. The first pad P1 and the second pad P2 are connected to the first type semiconductor SM1 and the second type semiconductor SM2 through the openings of the cover portion 222, respectively. In other words, in the present embodiment, the covering portion 222 replaces the insulating layer I. In the present embodiment, the material of the auxiliary structure 220 includes a dielectric material such as tantalum nitride, hafnium oxide or other dielectric material The cover portion 222 overlaps the light emitting diode 210 in the vertical direction D. For example, the cover portion 222 overlaps a portion of the first type semiconductor SM1 and A portion of the second type semiconductor SM1 in the vertical direction D.

The protection portion 224 does not overlap the light emitting diode 210 in the vertical direction D. For example, the protection portion 224 is located at the first side S1 of the light emitting diode 210, and the protection portion 224 extends outward from the first side S1 of the light emitting diode 210.

The first anchor portion 226 and the protection portion 224 are respectively located at different sides of the light emitting diode 210.

Although the first anchor portion 226 is located at the second side S2 of the light emitting diode 210 in the present embodiment, the invention is not limited thereto. In other embodiments, the first anchor portion 226 is located at the third side S3 of the light emitting diode 210.

In other embodiments, the auxiliary structure 220 further includes a second anchor portion 226a, and the second anchor portion 226a is located at the fourth side S4 of the light emitting diode 210.

Figure 8:
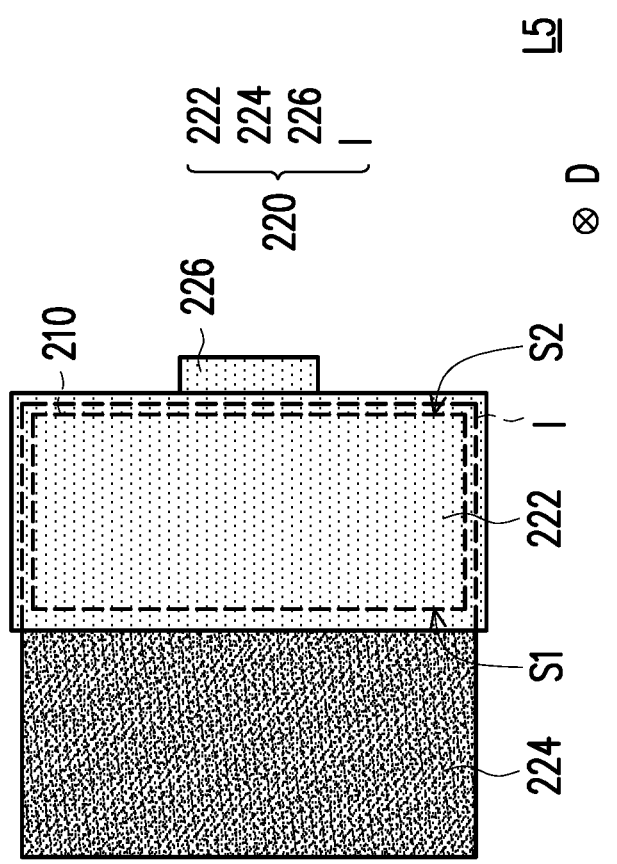
FIG. 8 is a schematic top view of a self-emissive element in accordance with an embodiment of the present invention.

FIG. 8 is a schematic top view of a self-emissive element in accordance with an embodiment of the present invention.

The structure of the self-emissive element L5 of FIG. 8 is, for example, similar to the first light-emitting element 200 and the second light-emitting element 200a of FIG. 2B, except that the protection portion 224 and the insulating layer I of the self-emissive element L5 belong to the same layer.

In the present embodiment, the protective portion 224 and the insulating layer I belong to the same layer, and the cover portion 222 and the first anchor portion 226 belong to another layer.

Figure 9:
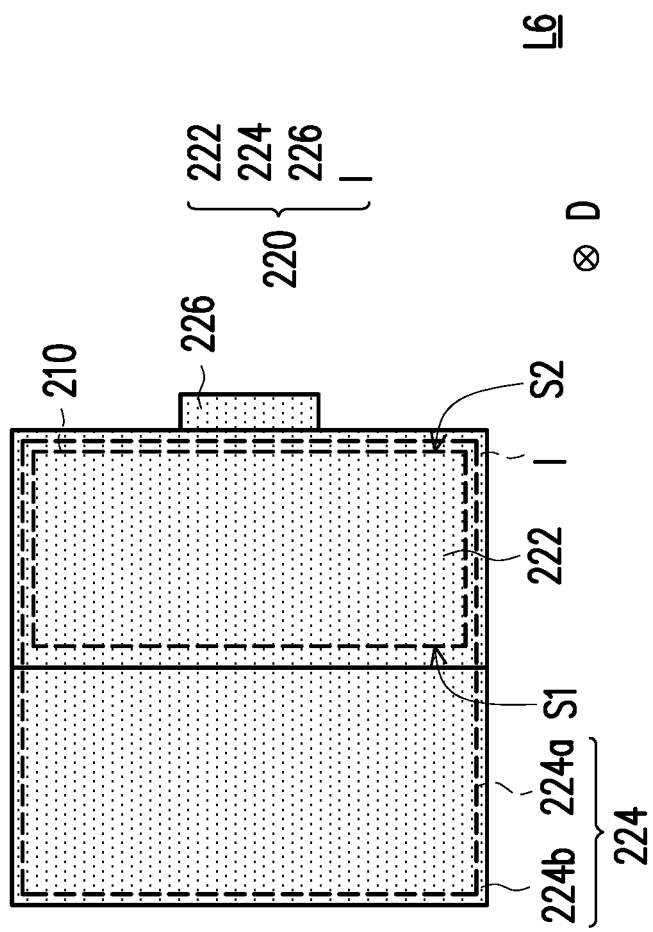
FIG. 9 is a schematic top view of a self-emissive element in accordance with an embodiment of the present invention.

FIG. 9 is a schematic top view of a self-emissive element in accordance with an embodiment of the present invention.

The structure of the self-emissive element L6 of FIG. 9 is, for example, similar to the self-emissive element L5 of FIG. 8 except that the protective portion 224 of the self-emissive element L6 has a double-layer structure.

In the present embodiment, the protective portion 224 includes a first layer 224a which belong to same layer with the insulating layer I and a second layer 224b which belong to same layer with the cover portion 222.

Figure 10:
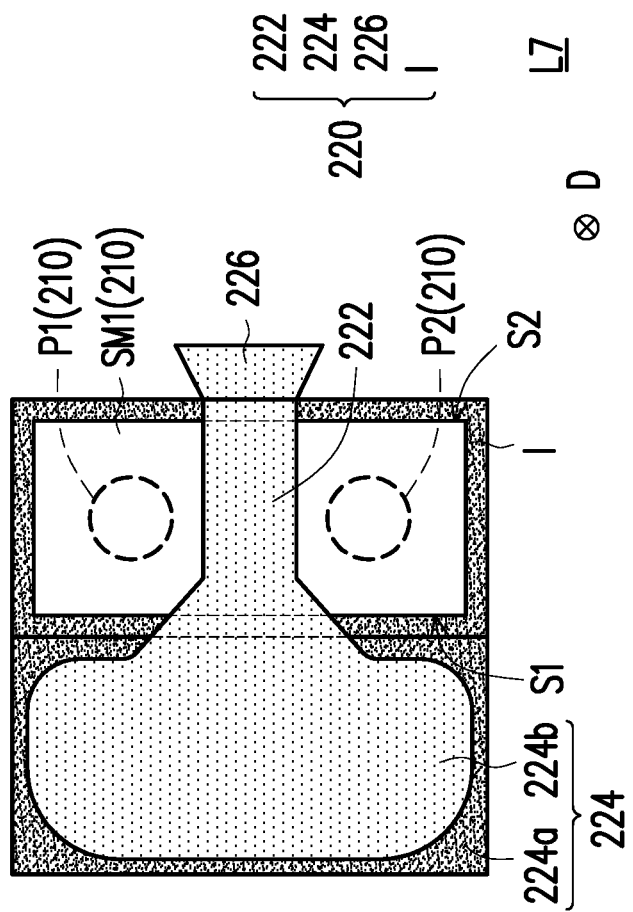
FIG. 10 is a schematic top view of a self-emissive element in accordance with an embodiment of the present invention.

FIG. 10 is a schematic top view of a self-emissive element in accordance with an embodiment of the present invention.

The structure of the self-emissive element L7 of FIG. 10 is, for example, similar to the self-emissive element L6 of FIG. 9 except that the orthographic projection area of the cover portion 222 of the self-emissive element L7 in the vertical direction D is smaller than the orthographic area of the light-emitting diode 210 in the vertical direction D.

Figure 11:
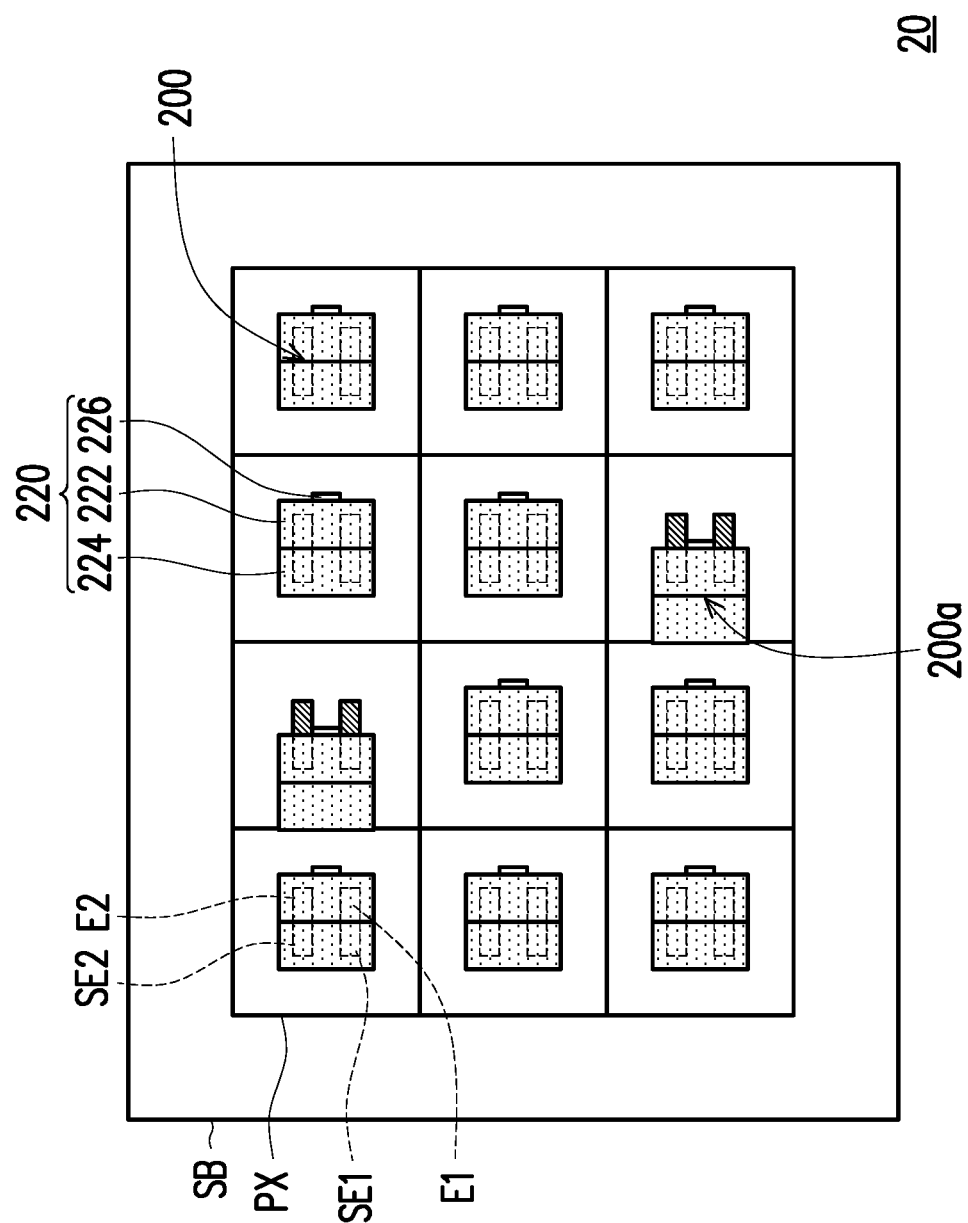
FIG. 11 is a top schematic view of a light emitting device in accordance with an embodiment of the present invention.

FIG. 11 is a schematic top view of a light emitting device in accordance with an embodiment of the present invention.

The structure of the light-emitting device 20 of FIG. 11 is, for example, similar to the light-emitting device 10 of FIG. 1C except that the first auxiliary electrode SE1 of the light-emitting device 20 is structurally connected to the first electrode E1 and has the same electric potential with the first electrode E1, and the auxiliary electrode SE2 of the light-emitting device 20 is structurally connected to the second electrode E2 and has the same electric potential with the second electrode E2.

Figure 12A:
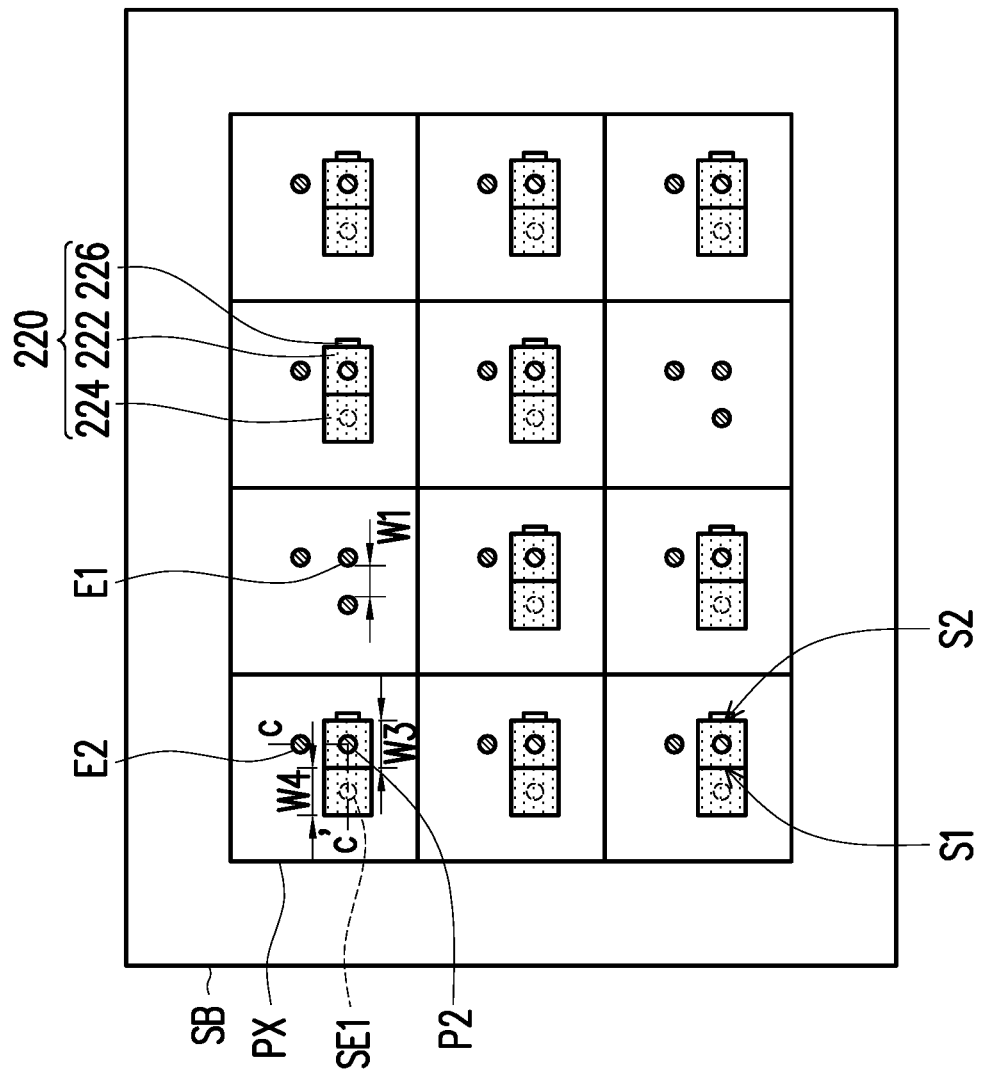
FIGS. 12A to 12C are schematic top views showing a manufacturing method of a light emitting device in accordance with an embodiment of the present invention.
Figure 12B:
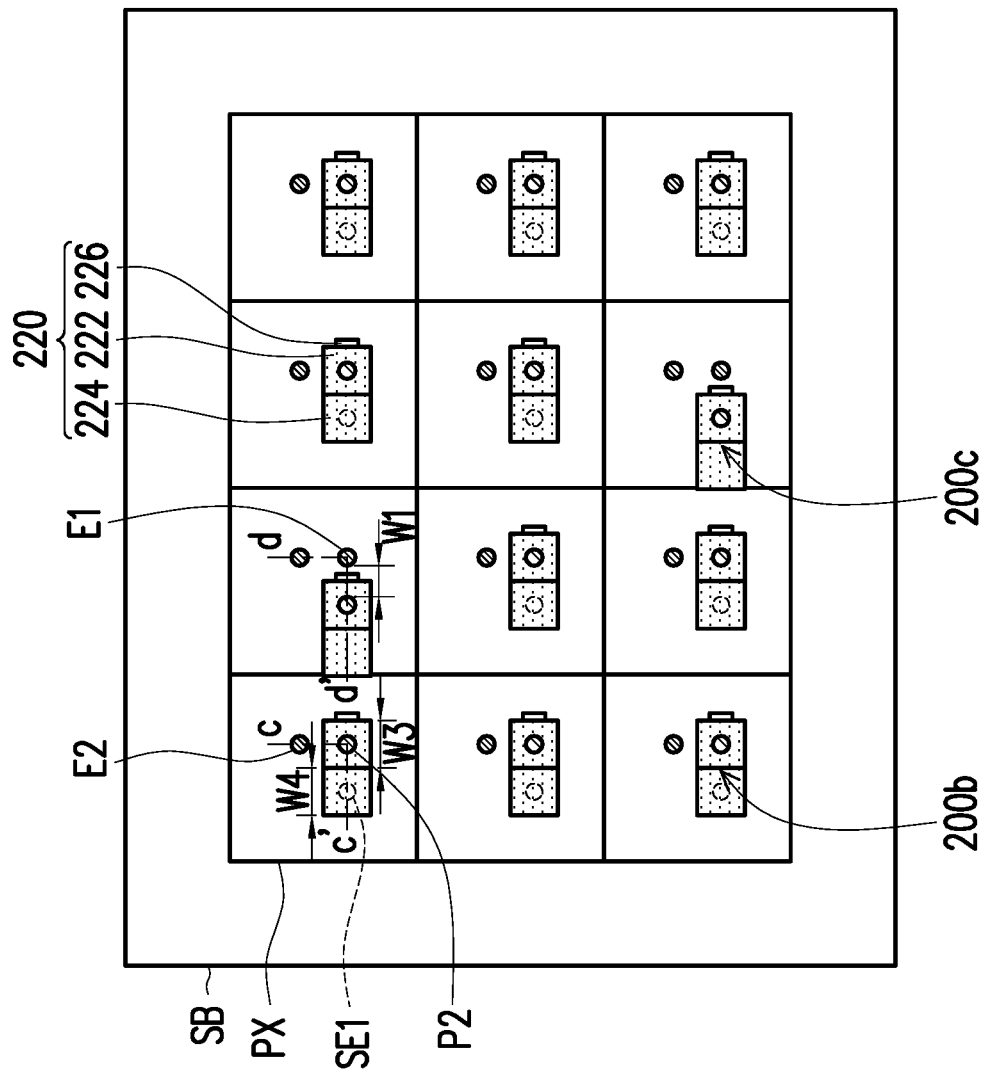
Figure 12C:
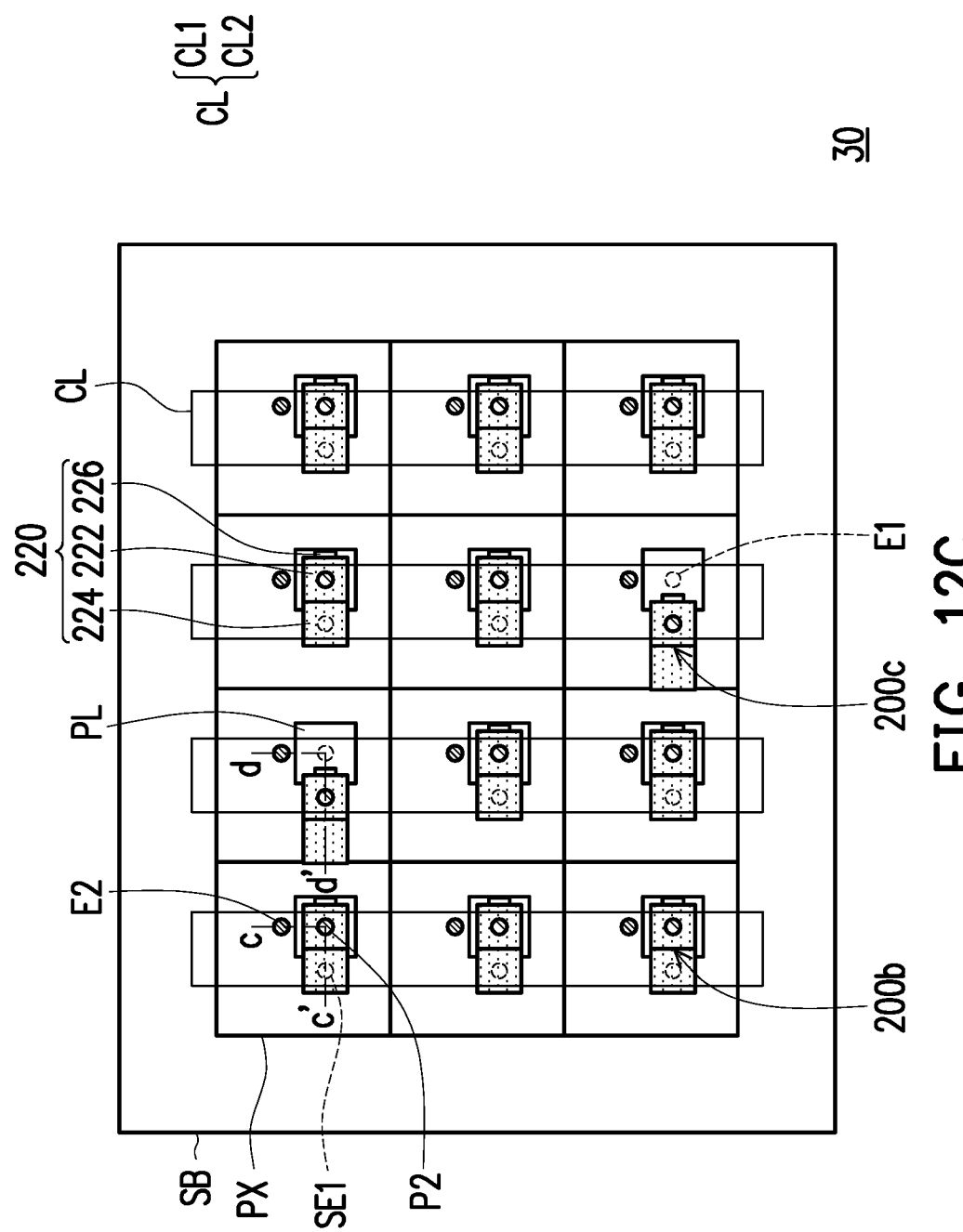
Figure 13A:
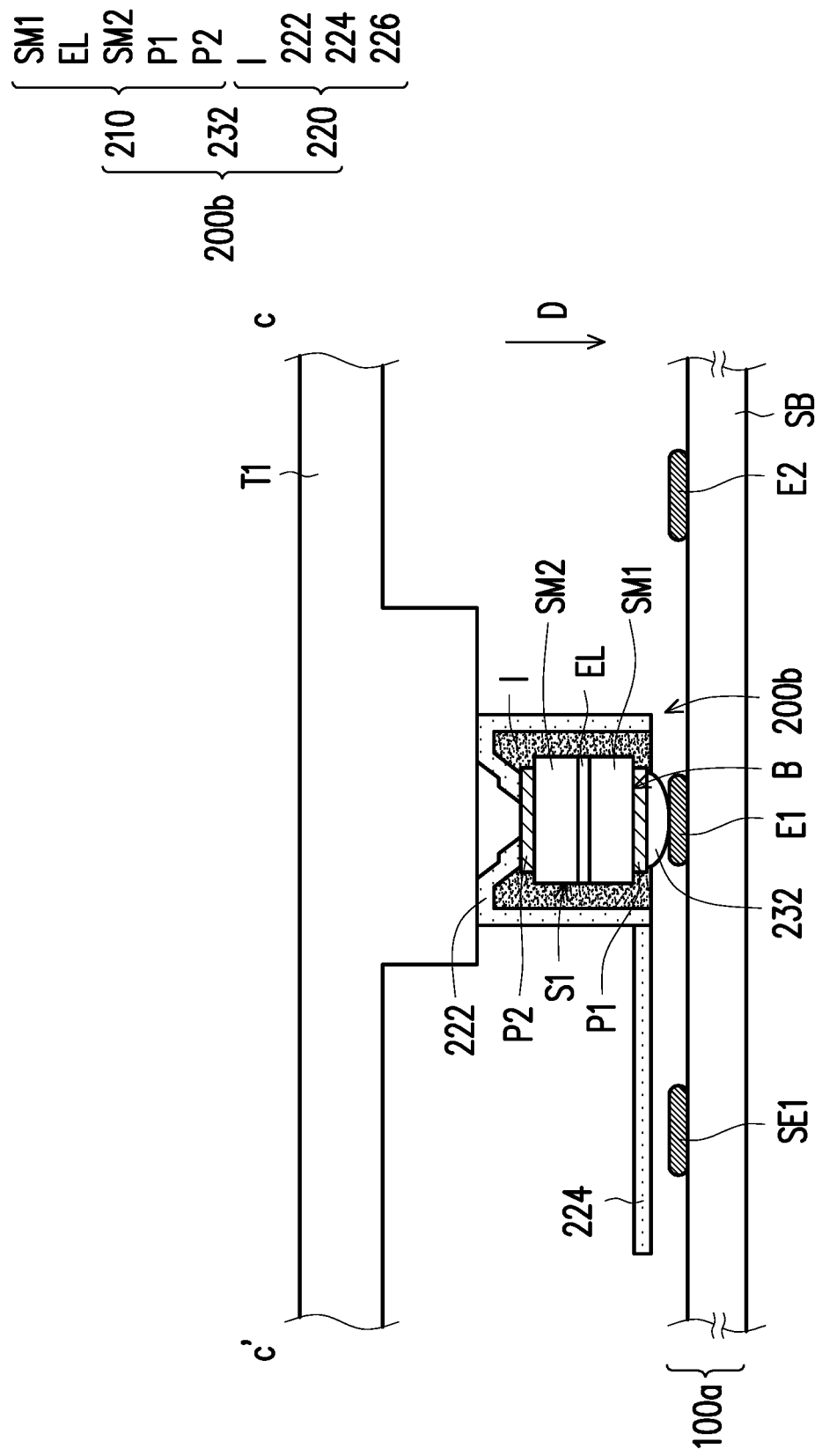
FIG. 13A is a schematic cross-sectional view taken along line cc' of FIG. 12A.
Figure 13B:
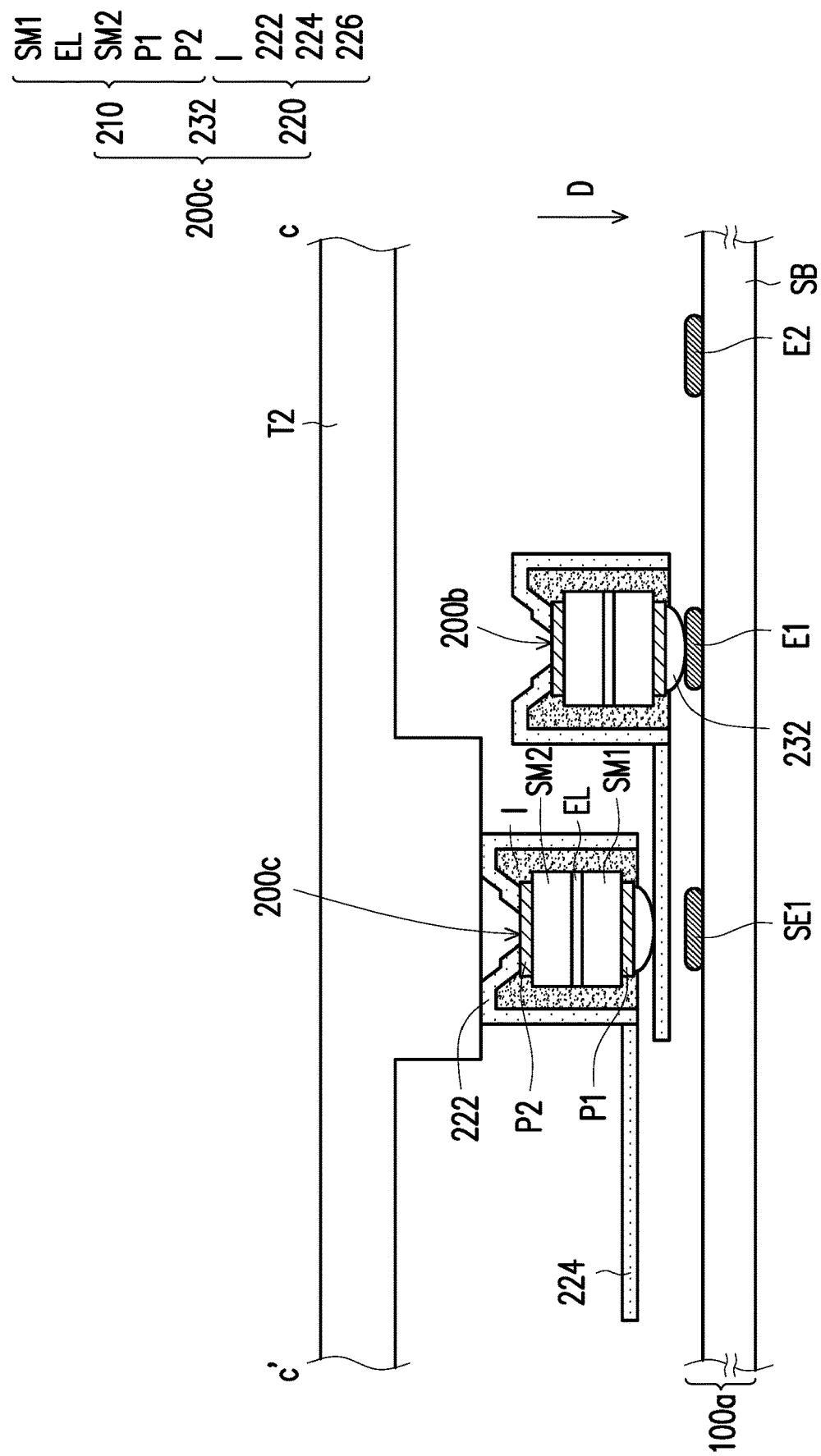
FIG. 13B is a schematic cross-sectional view taken along line cc' of FIG. 12B.
Figure 13C:
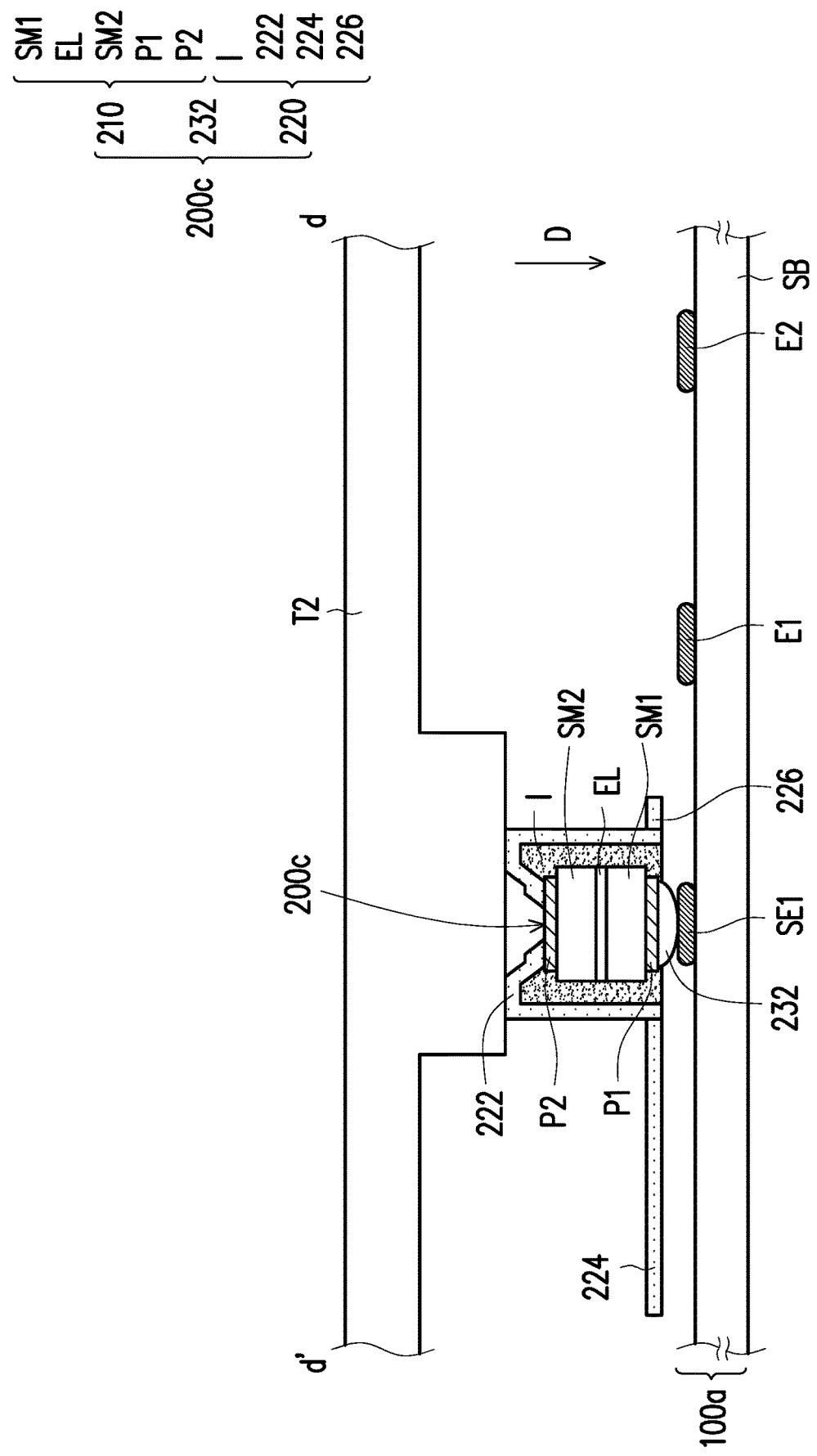
FIG. 13C is a schematic cross-sectional view taken along line dd' of FIG. 12B.
Figure 13D:
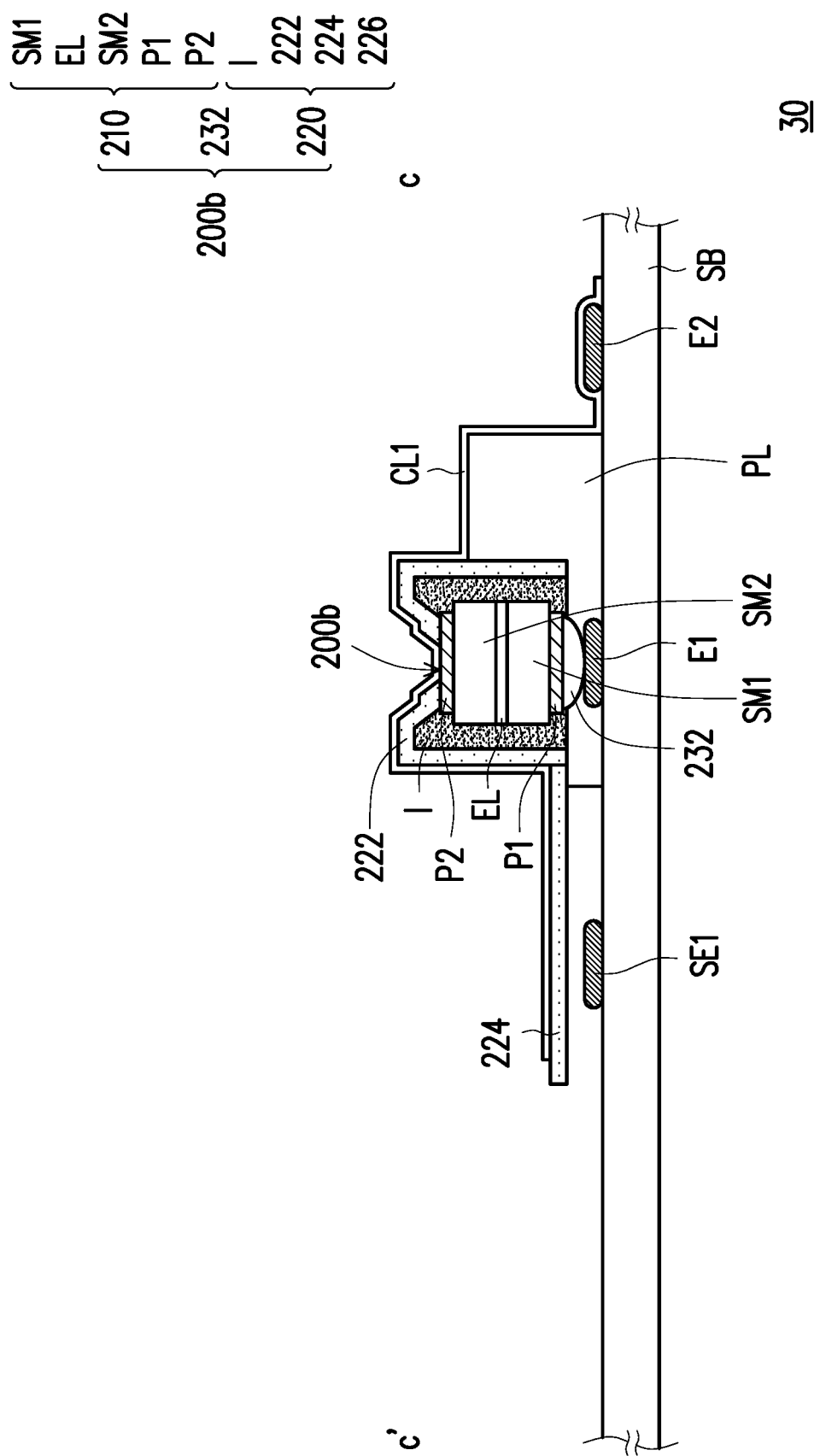
FIG. 13D is a schematic cross-sectional view taken along line cc' of FIG. 12C.
Figure 13E:
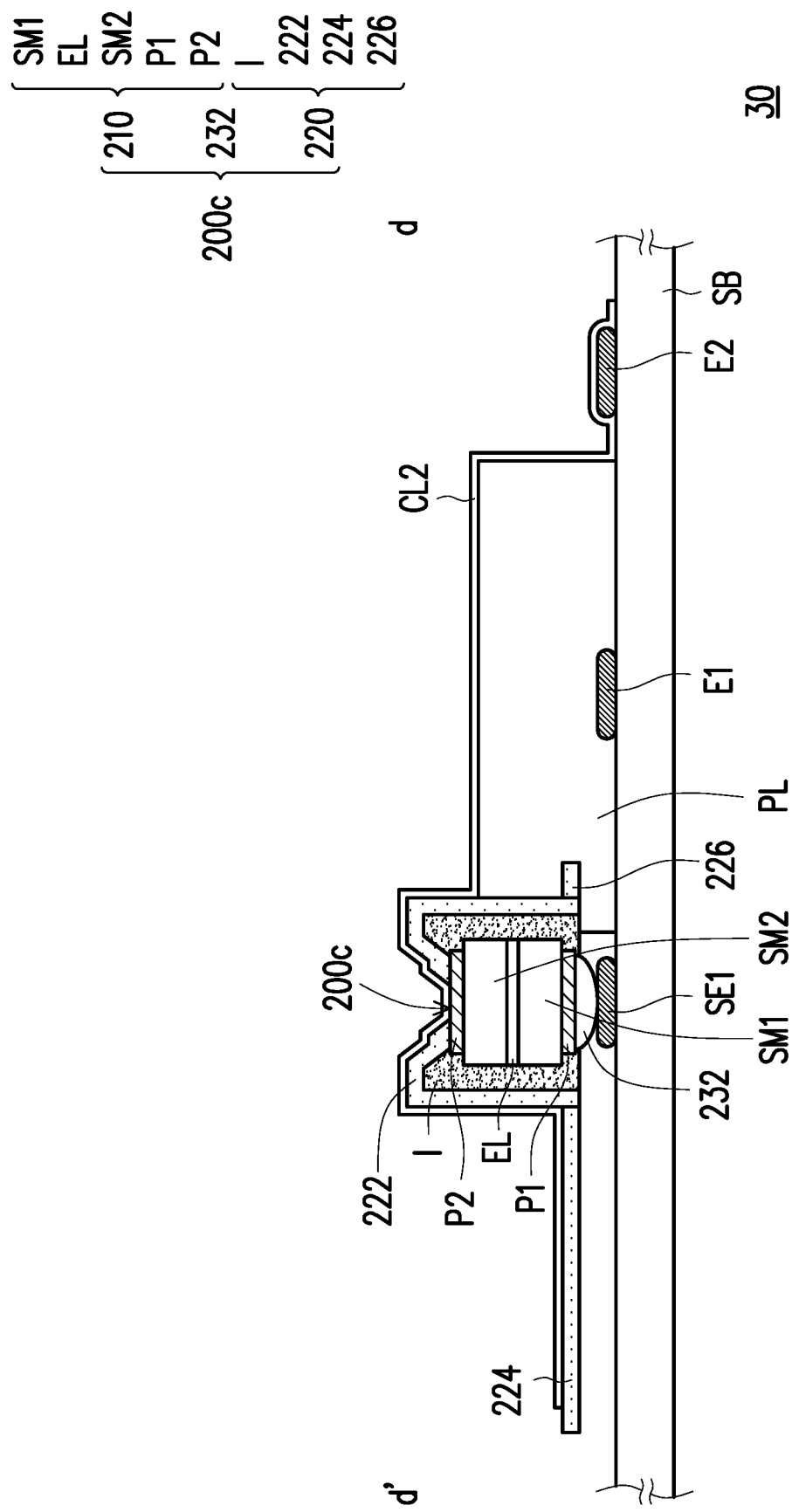
FIG. 13E is a schematic cross-sectional view taken along line dd' of FIG. 12C.

FIGS. 12A to 12C are schematic top views showing a method of fabricating a light emitting device in accordance with an embodiment of the present invention. FIG. 13A is a schematic cross-sectional view taken along line cc' of FIG. 12A. FIG. 13B is a schematic cross-sectional view taken along line cc' of FIG. 12B. FIG. 13C is a schematic cross-sectional view taken along line dd' of FIG. 12B. FIG. 13D is a schematic cross-sectional view taken along line cc' of FIG. 12C. FIG. 13E is a schematic cross-sectional view taken along line dd' of FIG. 12C. For convenience of explanation, some components in FIGS. 13A to 13E are omitted from FIGS. 12A to 12C.

Referring to FIG. 12A and FIG. 13A, a pixel circuit substrate 100a is provided. The pixel circuit substrate 100a includes a substrate SB and a plurality of driving structures PX on the substrate SB. Each of the driving structures PX includes a first electrode E1 and a second electrode E2. In the present embodiment, the pixel circuit substrate 100a further includes a first auxiliary electrode SE1.

A first transposition process is performed to provide the first light emitting element 200b onto one of the driving structures PX. For convenience of explanation, the transposition device T1 is omitted from FIG. 12A.

In the present embodiment, the first transposition process is, for example, a massive transfer, and a first transposition process is performed to provide a plurality of first light-emitting elements 200b on the plurality of drive structures PX. The first transposition process is, for example, transferring the first light-emitting elements 200b by the transposition device T1. The transposition device T1 picks up the first light-emitting elements 200b by, for example, electrostatic adsorption, vacuum adsorption, van der Waals adsorption, or the like. After the first transposition process is performed, the transposition device T1 is removed.

In the present embodiment, the first light emitting elements 200b are a self-emissive element, and includes a light emitting diode 210 and an auxiliary structure 220. The light emitting diode 210 includes a first type semiconductor SM1, a second type semiconductor SM2, a first pad P1, and a second pad P2. In the embodiment, the first light emitting element 200 further includes a first connection structure 232, and the light emitting diode 210 further includes an active layer EL.

The auxiliary structure 220 includes a cover portion 222, a protection portion 224, and a first anchor portion 226. In the present embodiment, the auxiliary structure 220 further includes an insulating layer I.

The insulating layer I covers the second type semiconductor SM2, the active layer EL, and the first type semiconductor SM1, and exposes a part of the second type semiconductor SM2 and a part of the first type semiconductor SM1. The first pad P1 is connected to the first type semiconductor SM1. The second pad P2 is connected to the second type semiconductor SM2. The first pad P1 and the second pad P2 comprise a conductive material. In this embodiment, the light emitting diode 210 is a vertical light emitting diode, and the first pad P1 and the second pad P2 are respectively located at different sides of the light emitting diode 210.

The cover portion 222 overlaps the light emitting diode 210 in the vertical direction D. For example, the cover portion 222 overlaps the bottom surface B of the first type semiconductor SM1 in the vertical direction D.

The protection portion 224 does not overlap the light emitting diode 210 in the vertical direction D. For example, the protection portion 224 is located at the first side S1 of the light emitting diode 210, and the protection portion 224 extends outward from the first side S1 of the light emitting diode 210. The orthographic projection area of the protection portion 224 in the vertical direction D is greater than or equal to the orthographic projection area of the light-emitting diode 210 in the vertical direction D.

The first anchor portion 226 and the protection portion 224 are respectively located at different sides of the light emitting diode 210.

The first connection structure 232 is located on the first pad P1. The first connection structure 232 is, for example, a solder.

In this embodiment, after performing the first transposition process, the first pad P1 of the first light emitting element 200b and the first electrode E1 of the driving structure PX are electrically connected.

The first pad P1 of the first light emitting element 200b faces the pixel circuit substrate 100a. In the present embodiment, the method of electrically connecting the first pad P1 of the first light-emitting element 200b with the first electrode E1 includes, for example, eutectic bonding or the like, but the invention is not limited thereto.

The protection portion 224 of the first light-emitting element 200b is overlapped with the first auxiliary electrode SE1 of the driving structure PX. In some embodiments, the distance W1 between the first electrode E1 and the first auxiliary electrode SE1 is greater than the width W3 of the light emitting diode 210. The distance W1 is smaller than the width W4 of the protection portion 224 such that the first auxiliary electrode SE1 may be easier covered by the protection portion 224, but the invention is not limited thereto.

In the present embodiment, after performing the first transposition process, the first light-emitting elements 200b are not successfully disposed on a portion of the driving structures PX. For example, the first transposition process moves a plurality of (eg, twelve) first light-emitting elements 200b at one time, however, two of the first light-emitting elements 200b fall during the transposition, resulting in the first light-emitting elements 200b are not disposed on the two of the driving structures PX.

Referring to FIG. 12B, FIG. 13B and FIG. 13C, a second transposition process is performed to provide the second light-emitting element 200c on the other driving structure PX (the driving structure PX of the first light-emitting element 200b is not successfully disposed). For convenience of explanation, FIG. 12B omits the transposition device T2 and the second light-emitting element 200c that is not connected to the pixel circuit substrate 100a.

In the present embodiment, the second transposition process is, for example, a massive transfer, and a second transposition process is performed to provide a plurality of second light-emitting elements 200c on the plurality of driving structures PX. For example, the second transposition process moves a plurality (eg, twelve) of second illuminating elements 200c at one time. The second transposition process is, for example, moving the second light-emitting elements 200c by the transposition device T2, and the method of picking up the second light-emitting elements 200c by the transposition device T2 is, for example, electrostatic adsorption, vacuum adsorption, van der Waals adsorption or the like. After the second transposition process is performed, the transposition device T2 is removed.

In the present embodiment, the second light emitting element 200c is self-emissive element, and includes a light emitting diode 210 and an auxiliary structure 220. The light emitting diode 210 includes a first type semiconductor SM1, a second type semiconductor SM2, a first pad P1, and a second pad P2. In the embodiment, the first light emitting element 200 further includes a first connection structure 232, and the light emitting diode 210 further includes an active layer EL. The second light-emitting element 200c has a similar structure to the first light-emitting element 200b, and thus will not be described herein.

The position of the second transposition process corresponding to the pixel circuit substrate 100a is deviating from the position of the first transposition process corresponding to the pixel circuit substrate 100a. In this embodiment, the first connection structure 232 of the first light-emitting element 200b is in contact with the first electrode E1 of the pixel circuit substrate 100a by the first transposition process, and the connection structure 232 of the second light-emitting element 200c is in contact with the first auxiliary electrode SE1 of the pixel circuit substrate 100a by the second transposition process.

Referring to FIG. 13B, on the driving structure PX in which the first light-emitting element 200b is successfully disposed, the second light-emitting element 200c is blocked by the protection layer 224 of the first light-emitting element 200b, so that the connection structure 232 of the second light-emitting element 200c may not be in contact with the first auxiliary electrode SE1 of the pixel circuit substrate 100a.

Referring to FIG. 13C, on the driving structure PX in which the first light emitting element 200b is not successfully disposed, the first connection structure 232 of the second light emitting element 200c contacts the first auxiliary electrode SE1 of the pixel circuit substrate 100a.

In this embodiment, after performing the second transposition process, the first pad P1 of the second light-emitting element 200c and the first auxiliary electrode SE1 of the driving structure PX are electrically connected.

The first pad P1 of the second light-emitting element 200c faces the pixel circuit substrate 100a. In the present embodiment, the method of electrically connecting the first pad P1 of the second light-emitting element 200c with the first auxiliary electrode SE1 includes eutectic bonding or the like, but the invention is not limited thereto.

Since the second light-emitting element 200c cannot be bonded to the first auxiliary electrode SE1 of the pixel circuit substrate 100a on the driving structure PX on which the first light-emitting element 200b is successfully disposed, the second light-emitting element 200c will not remain on the driving structures PX on which the first light-emitting element 200b is successfully disposed. The second light-emitting elements 200c blocked by the protection layers 224 of the first light-emitting elements 200b remain on the transposition device T2.

In the present embodiment, the first auxiliary electrode SE1 of each driving structure PX has the same electric potential with the first electrode E1. Therefore, regardless of whether the first light-emitting element 200b or the second light-emitting element 200c is disposed on the driving structure PX, the light-emitting device can be operated normally.

Referring to FIGS. 12C, 13D, and 13E, a planarization layer PL is formed on the driving structure PX. The material of the planarization layer PL is, for example, an insulating material. In the present embodiment, the planarization layer PL surrounds the first electrode E1, but the invention is not limited thereto. In other embodiments, the planarization layer PL surrounds the first electrode E1 and the first auxiliary electrode SE1.

Although in the present embodiment, the planarization layer PL is formed after the second transposition process, the invention is not limited thereto. In other embodiments, the planarization layer PL is formed on the drive structure PX prior to performing the first transposition process and/or prior to performing the second transposition process.

The first conductive layer CL1 is formed on the first light-emitting element 200b to electrically connect the second pad P2 of the first light emitting element 200b and the second electrode E2 of the driving structure PX. The second conductive layer CL2 is formed on the second light-emitting element 200c to electrically connect the second pad P2 of the second light-emitting element 200c and the second electrode E2 of the driving structure PX. The material of the first conductive layer CL1 and the second conductive layer CL2 is, for example, a transparent conductive material.

In the present embodiment, the first conductive layer CL1 and the second conductive layer CL2 are connected together and constitute a conductive layer CL. In other words, the conductive layer CL on the first light-emitting element 200b is the first conductive layer CL1, and the conductive layer CL on the second light-emitting element 200c is the second conductive layer CL2.

Based on the above, since the second light-emitting element 200c remaining on the transposition device T2 can be used for the next transposition process, the material cost required to repair the light-emitting device 30 can be reduced. Further, since the second transposition process can provide the second light-emitting elements 200c on the plurality of driving structures PX on which the first light-emitting elements 200b are not successfully disposed at one time, the time cost required to repair the light-emitting device 30 can be reduced.

Figure 14:
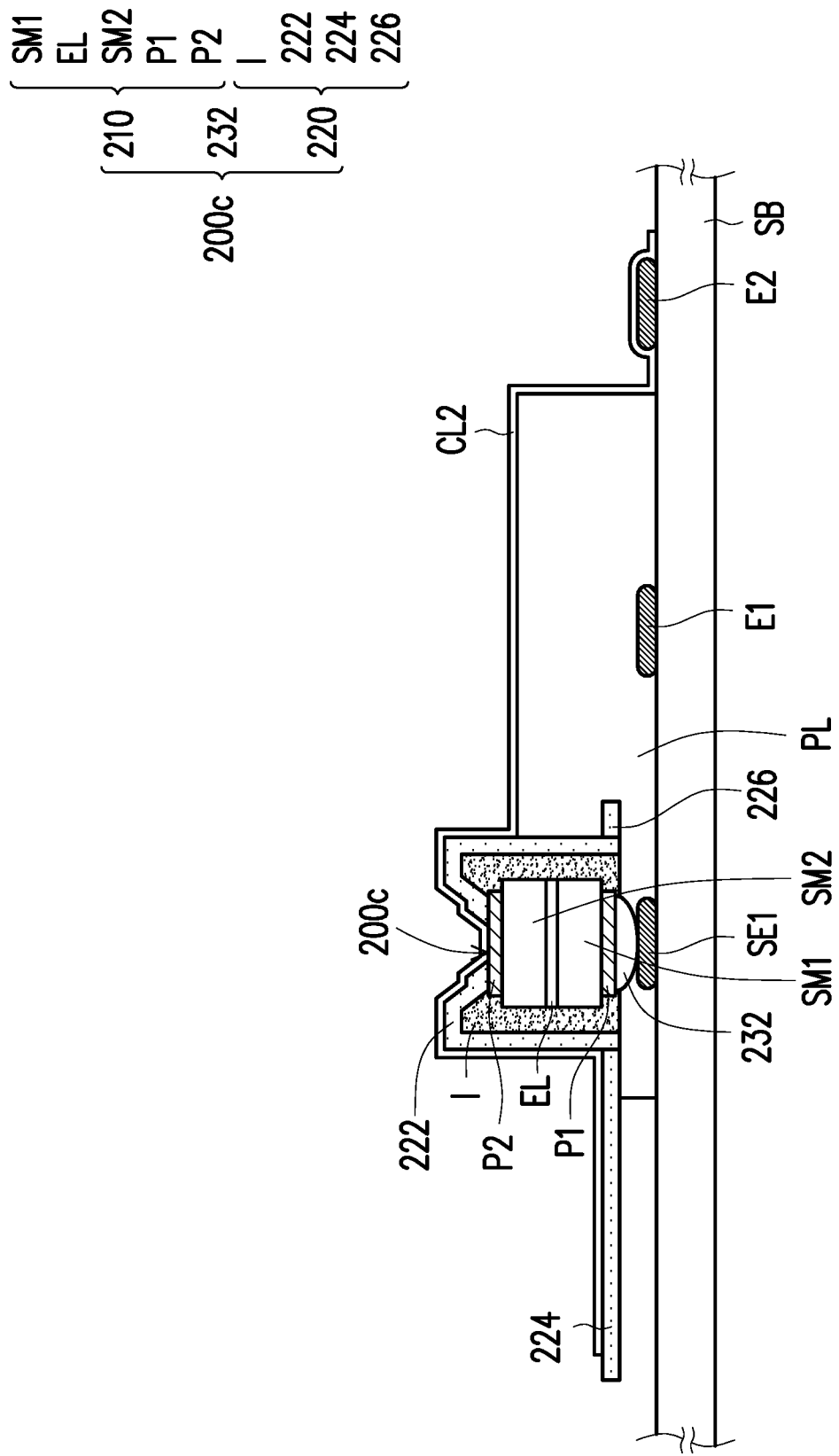
FIG. 14 is a schematic cross-sectional view of a light emitting device in accordance with an embodiment of the present invention.

FIG. 14 is a schematic cross-sectional view of a light-emitting device in accordance with an embodiment of the present invention.

The main difference between the light-emitting device 40 of FIG. 14 and the light-emitting device 30 of FIG. 13E is that the planarization layer PL of the light-emitting device 40 surrounds the first electrode E1 and the first auxiliary electrode SE1.

Figure 15A:
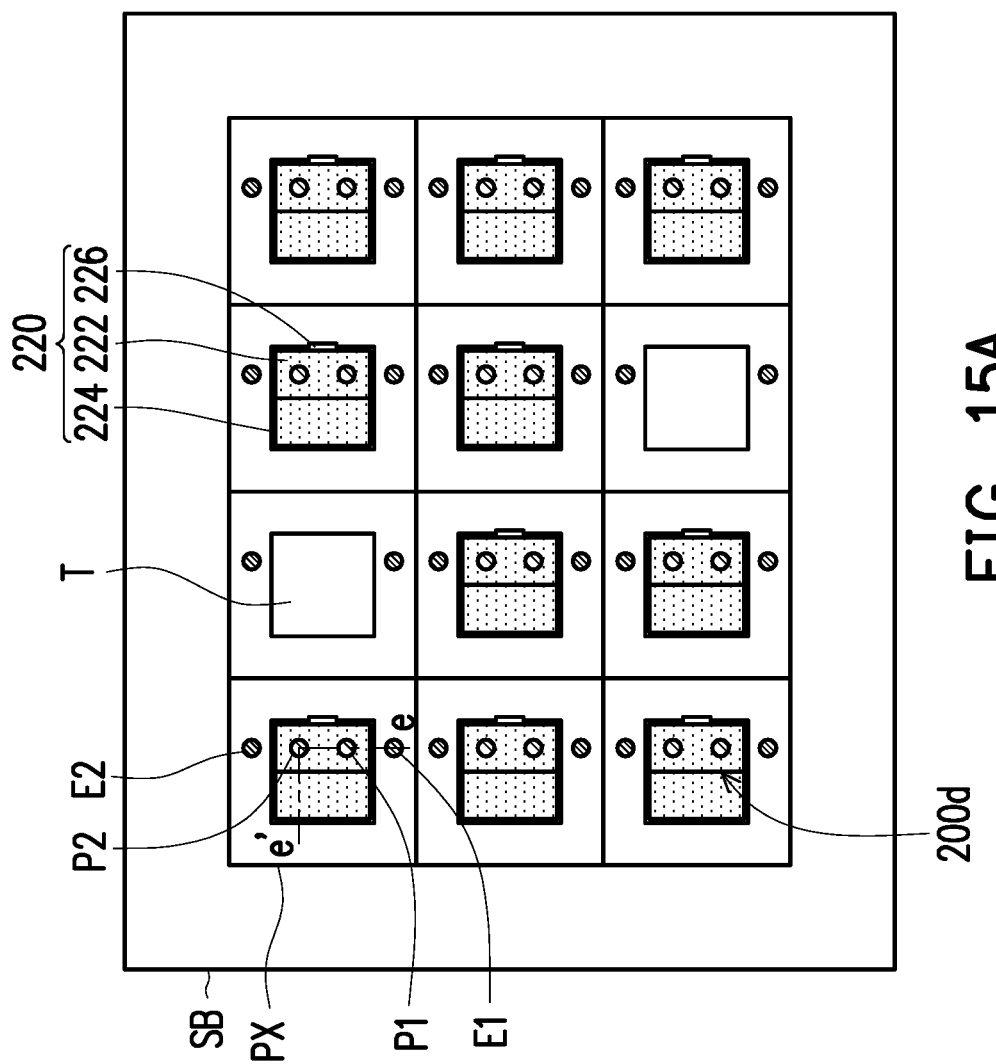
FIGS. 15A to 15C are schematic top views of a method of fabricating a light emitting device in accordance with an embodiment of the present invention.
Figure 15B:
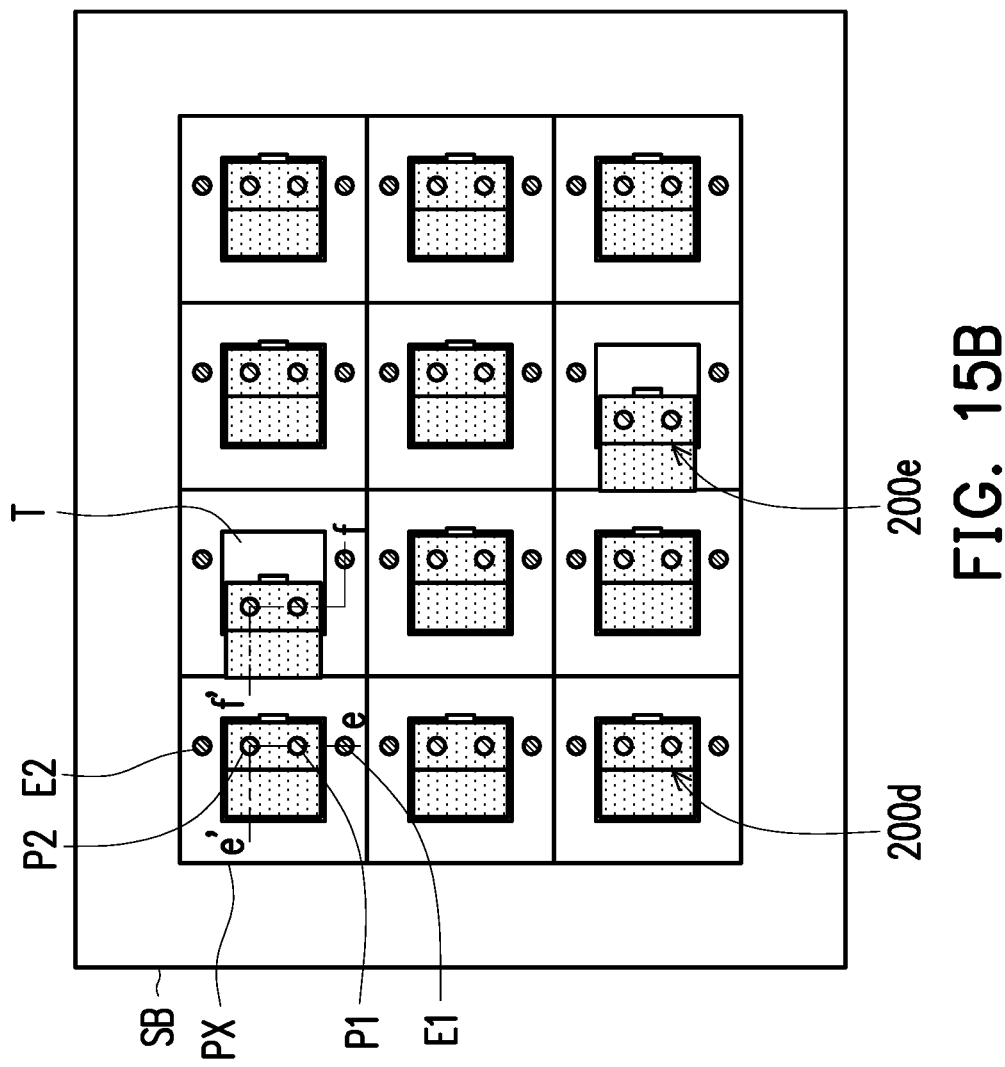
Figure 15C:
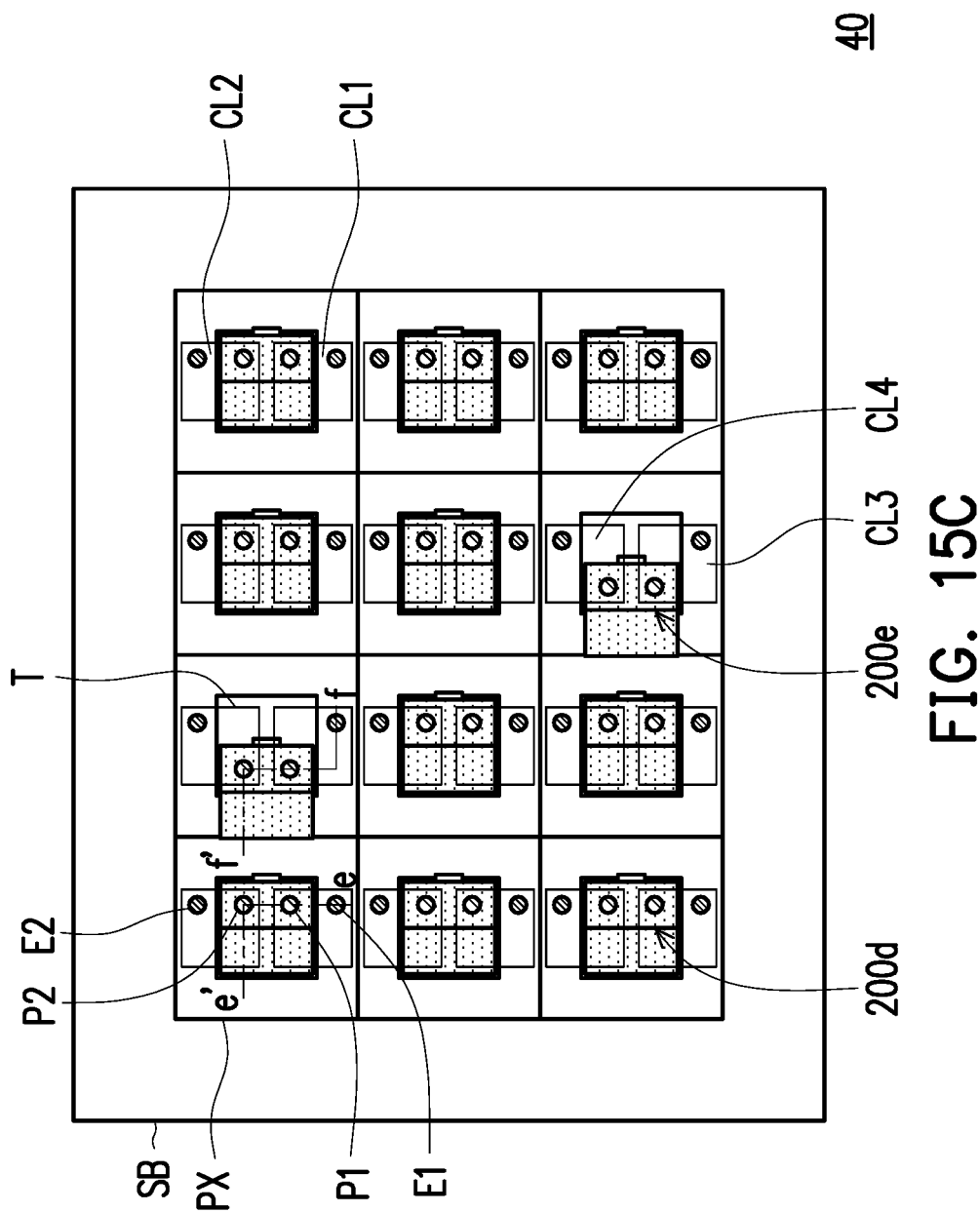
Figure 16A:
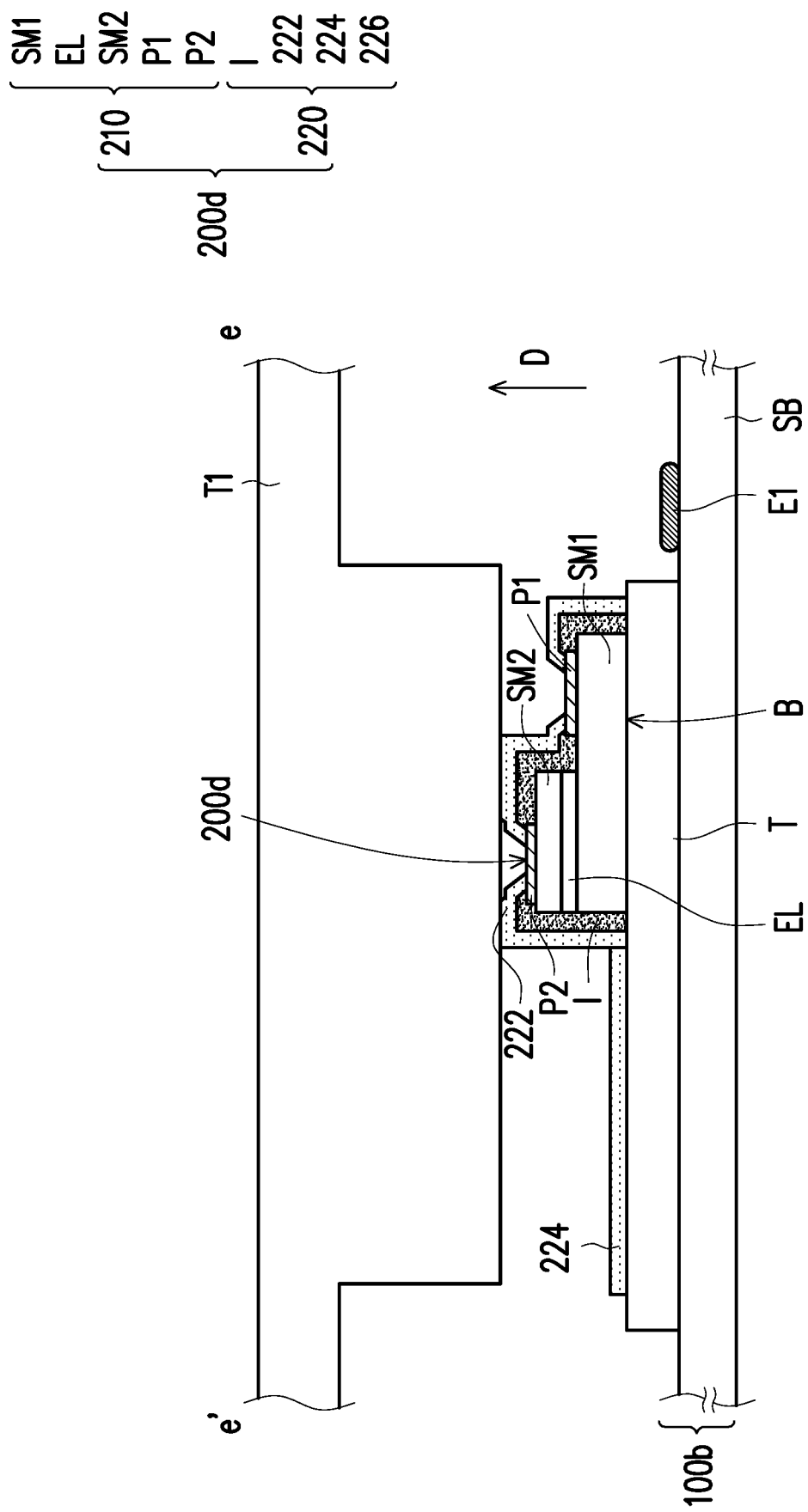
FIG. 16A is a schematic cross-sectional view taken along line ee' of FIG. 15A.
Figure 16B:
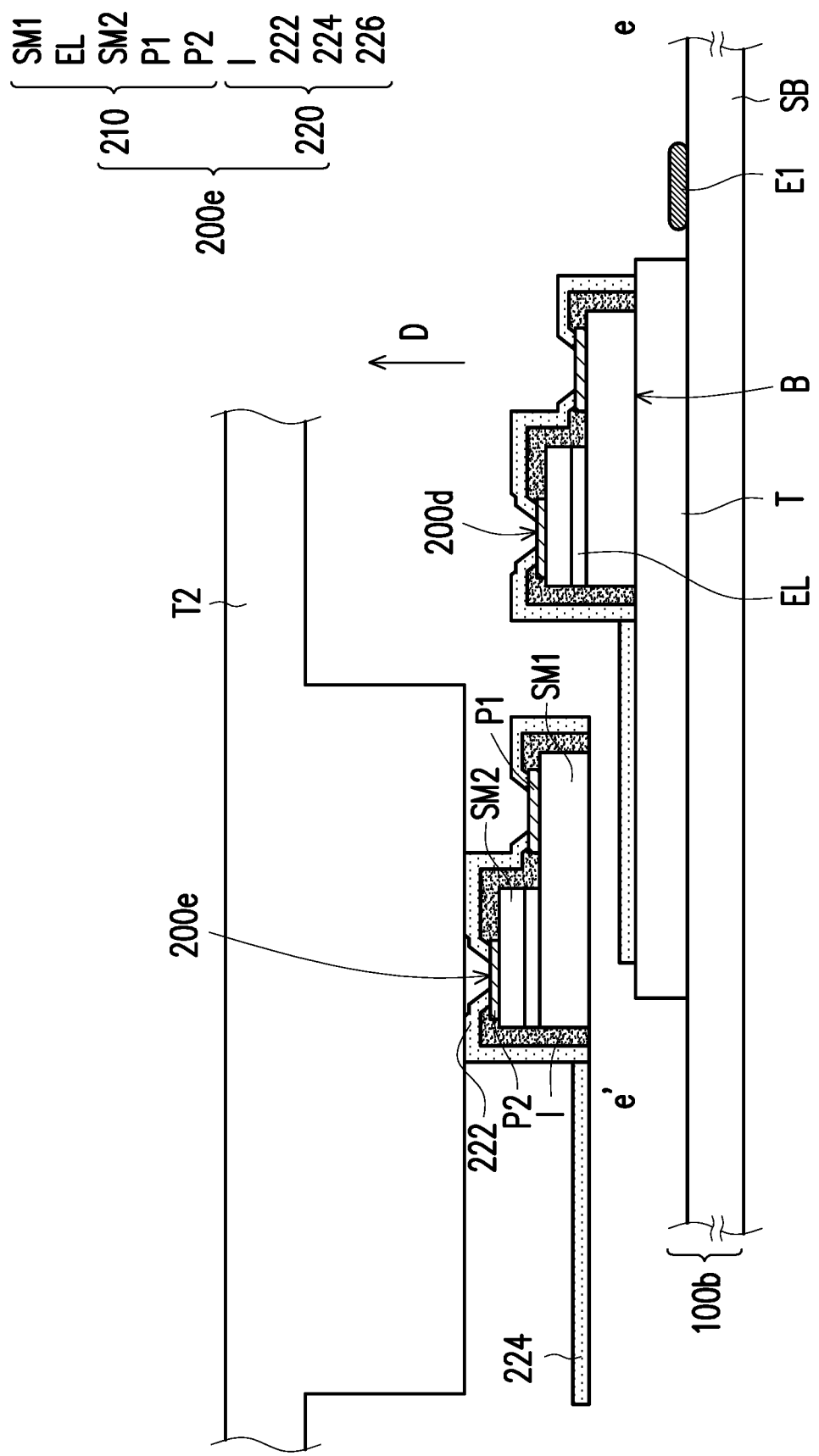
FIG. 16B is a schematic cross-sectional view taken along line ee' of FIG. 15B.
Figure 16C:
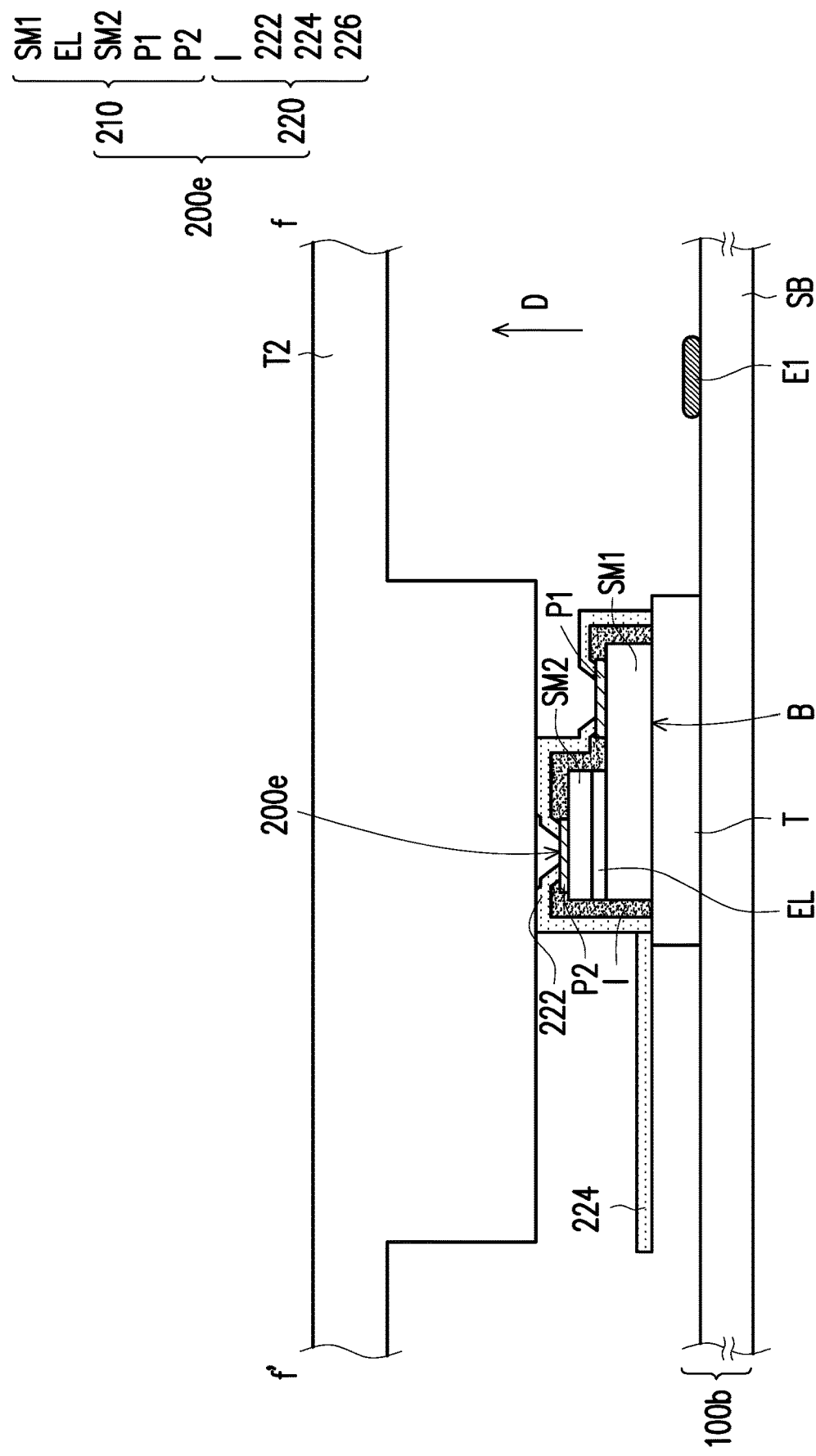
FIG. 16C is a schematic cross-sectional view taken along line ff' of FIG. 15B.
Figure 16D:
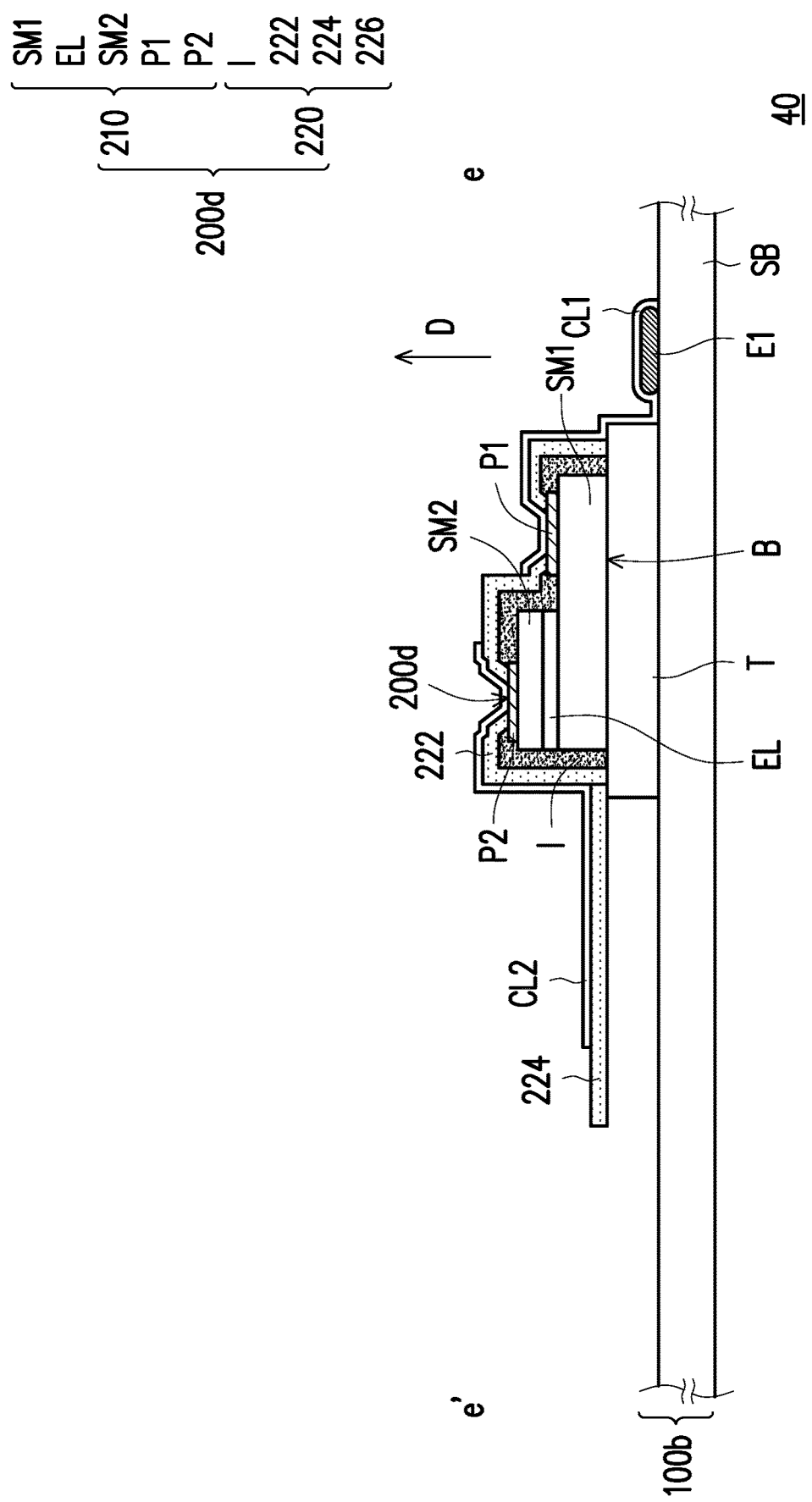
FIG. 16D is a schematic cross-sectional view of the section line ee' of FIG. 15C.
Figure 16E:
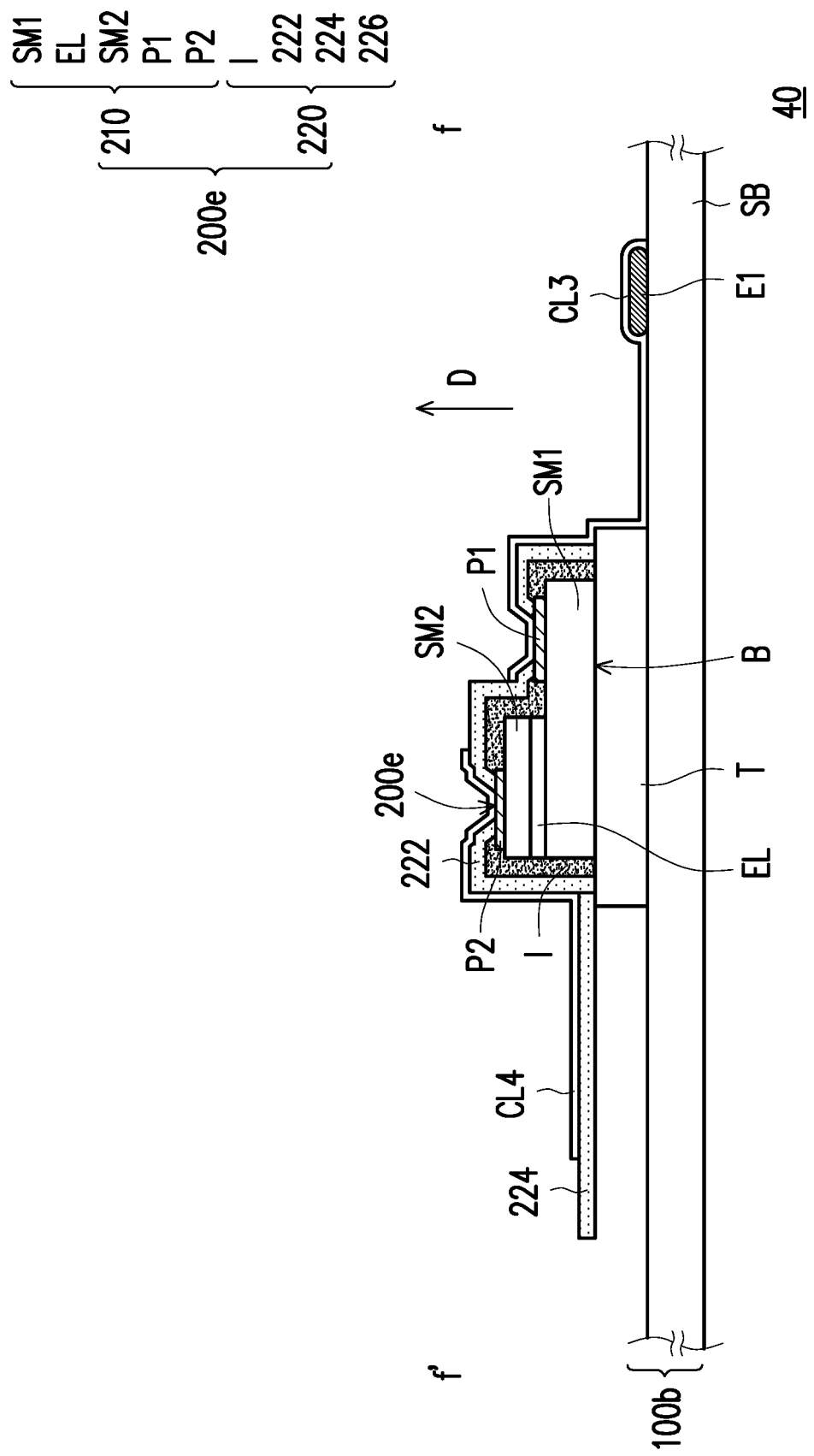
FIG. 16E is a schematic cross-sectional view taken along line ff' of FIG. 15C.

FIGS. 15A to 15C are schematic top views showing a method of fabricating a light emitting device in accordance with an embodiment of the present invention. FIG. 16A is a schematic cross-sectional view taken along line ee' of FIG. 15A. FIG. 16B is a schematic cross-sectional view taken along line ee' of FIG. 15B. FIG. 16C is a schematic cross-sectional view taken along line ff' of FIG. 15B. FIG. 16D is a schematic cross-sectional view of the section line ee' of FIG. 15C. FIG. 16E is a schematic cross-sectional view taken along line ff' of FIG. 15C.

Referring to FIG. 15A and FIG. 16A, a pixel circuit substrate 100b is provided. The pixel circuit substrate 100b includes a substrate SB and a plurality of driving structures PX on the substrate SB. Each of the driving structures PX includes a first electrode E1 and a second electrode E2. In the present embodiment, the adhesive layer T is formed on each of the driving structures PX of the pixel circuit substrate 100b.

The first transposition process is performed to provide the first light emitting element 200d on one of the driving structures PX. In this embodiment, the first transposition process is, for example, a massive transfer, and a first transposition process is performed to provide a plurality of first light-emitting elements 200d on the plurality of drive structures PX. The first transposition process is, for example, transferring the first light-emitting elements 200d by the transposition device T1, and the transposition device T1 picks up the first light-emitting elements 200d by, for example, electrostatic adsorption, vacuum adsorption, van der Waals adsorption, or the like. After the first transposition process is performed, the transposition device T1 is removed.

In the present embodiment, the first light-emitting element 200d is a self-emissive element, and includes a light emitting diode 210 and an auxiliary structure 220. The light emitting diode 210 includes a first type semiconductor SM1, a second type semiconductor SM2, a first pad P1, and a second pad P2. In the embodiment, the light emitting diode 210 further includes an active layer EL.

The auxiliary structure 220 includes a cover portion 222, a protection portion 224, and a first anchor portion 226. In the present embodiment, the auxiliary structure 220 further includes an insulating layer I.

The insulating layer I covers the second type semiconductor SM2, the active layer EL, and the first type semiconductor SM1, and exposes a part of the second type semiconductor SM2 and a part of the first type semiconductor SM1. The first pad P1 is connected to the first type semiconductor SM1. The second pad P2 is connected to the second type semiconductor SM2. The first pad P1 and the second pad P2 comprise a conductive material. In this embodiment, the light-emitting diode 210 is horizontal light emitting diode, and the first pads P1 and the second pads P2 are located on the same side of the light emitting diode 210.

The cover portion 222 overlaps the light-emitting diode 210 in the vertical direction D. For example, the cover portion 222 overlaps the bottom surface B of the first type semiconductor SM1 in the vertical direction D.

The protection portion 224 does not overlap the light-emitting diode 210 in the vertical direction D. The orthographic projection area of the protection portion 224 in the vertical direction D is greater than or equal to the orthographic projection area of the light-emitting diode 210 in the vertical direction D. The protection portion 224 and the light-emitting diode 210 of the first light-emitting element 200d are overlapped with the adhesive layer T. In other words, the cover portion 222 and the protection portion 224 overlap the adhesive layer T in the vertical direction D.

The first anchor portion 226 and the protection portion 224 are respectively located at different sides of the light-emitting diode 210.

Referring to FIG. 15B, FIG. 16B and FIG. 16C, a second transposition process is performed to provide the second light-emitting element 200e on the other driving structure PX (the driving structure PX of the first light-emitting element 200d is not successfully disposed). In the present embodiment, the second transposition process is, for example, a massive transfer, and a second transposition process is performed to provide a plurality of second light-emitting elements 200e on the plurality of drive structures PX. For example, the second transposition process moves a plurality (eg, twelve) of second light-emitting elements 200e at one time. The second transposition process is, for example, transferring the second light-emitting element 200e by the transposition device T2, and the method of picking up the second light-emitting element 200e by the transposition device T2 is, for example, electrostatic adsorption, vacuum adsorption, van der Waals adsorption or the like. After the second transposition process is performed, the transposition device T2 is removed.

In the present embodiment, the second light-emitting element 200e is a self-emissive element, and includes a light-emitting diode 210 and an auxiliary structure 220. The light-emitting diode 210 includes a first type semiconductor SM1, a second type semiconductor SM2, a first pad P1, and a second pad P2. In the embodiment, the light-emitting diode 210 further includes an active layer EL. The second light-emitting element 200e has a similar structure to the first light-emitting element 200d, and thus will not be described herein.

The position of the second transposition process corresponding to the pixel circuit substrate 100b is deviating from the position of the first transposition process corresponding to the pixel circuit substrate 100b.

Referring to FIG. 16B, on the driving structure PX on which the first light emitting element 200d is successfully disposed, the adhesive layer T under the second light-emitting element 200e is blocked by the protection layer 224 of the first light emitting element 200d such that the second light-emitting element 200e can not be in contact with the adhesive layer T.

Referring to FIG. 16C, on the driving structure PX on which the first light-emitting elements 200d are not successfully disposed, the second light-emitting element 200e is in contact with the adhesive layer T.

Since the second light-emitting elements 200e can not be in contact with the adhesive layer T on the driving structures PX on which the first light-emitting elements 200d are successfully disposed, the second light-emitting elements 200e can not remain on the driving structures PX on which the first light-emitting elements 200d are successfully disposed. The second light-emitting elements 200e blocked by the protection layers 224 of the first light-emitting elements 200d remain on the transposition device T2.

Referring to FIG. 15C, FIG. 16D and FIG. 16E, the first conductive layer CL1 is formed on the first light-emitting element 200d to electrically connect the first pad P1 of the first light-emitting element 200d with the first electrode E1 of the driving structure PX. The second conductive layer CL2 is formed on the first light-emitting element 200d to electrically connect the second pad P2 of the first light-emitting element 200d and the second electrode E2 of the driving structure PX. The third conductive layer CL3 is formed on the second light-emitting element 200e to electrically connect the first pad P1 of the second light-emitting element 200e with the first electrode E1 of the driving structure PX. The fourth conductive layer CL4 is formed on the second light emitting element 200e to electrically connect the second pad P2 of the second light-emitting element 200e and the second electrode E2 of the driving structure PX.

In the present embodiment, the materials of the first conductive layer CL1, the second conductive layer CL2, the third conductive layer CL3, and the fourth conductive layer CL4 include a transparent conductive material. In the present embodiment, the first conductive layer CL1, the second conductive layer CL2, the third conductive layer CL3, and the fourth conductive layer CL4 belong to the same conductive layer, but the invention is not limited thereto.

Based on the above, the light-emitting device 40 includes a self-emissive element including a light-emitting diode 210 and an auxiliary structure 220. The auxiliary structure 220 includes a cover portion 222, a protection portion 224, and a first anchor portion 226. The cover portion 222 overlaps the light-emitting diode 210 in the vertical direction. The protection portion 224 does not overlap the light-emitting diode 210 in the vertical direction. The orthographic projection area of the protection portion 224 in the vertical direction is greater than or equal to the orthographic projection area of the light-emitting diode 210 in the vertical direction. Since the self-emissive element includes the protection portion 224, the second transposition process has lower material cost and time cost.

In summary, the light-emitting device of the present invention includes a self-emissive element including a light-emitting diode and an auxiliary structure. The auxiliary structure includes a cover portion, a protection portion, and a first anchor portion. The cover portion overlaps the light-emitting diode in the vertical direction. The protection portion does not overlap the light-emitting diode in the vertical direction. The orthographic projection area of the protection portion in the vertical direction is greater than or equal to the orthographic projection area of the light-emitting diode in the vertical direction. Since the self-emissive element includes a protection portion, the second transposition process has lower material cost and time cost.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A self-emissive element comprising:
   a light-emitting diode comprising:
      a first type semiconductor;
      a second type semiconductor overlapped with the first type semiconductor in a vertical direction perpendicular to a bottom surface of the first type semiconductor;
      an active layer disposed between the first type semiconductor and the second type semiconductor;
      a first pad connecting with the first type semiconductor; and
      a second pad connecting with the second type semiconductor; and
   an auxiliary structure, including:
      a cover portion overlapped with the light-emitting diodes in the vertical direction;
      a protection portion not overlapped with the light-emitting diode in the vertical direction, wherein an orthographic projection area of the protection portion in the vertical direction is greater than or equal to an orthographic projection area of the light emitting diode in the vertical direction; and
      a first anchor portion, wherein the first anchor portion and the protection portion are respectively located at different sides of the light-emitting diode, wherein the protection portion and the first anchor portion are not overlapped with the first pad and the second pad in the vertical direction.

2. The self-emissive element as claimed in claim 1, wherein a material of the auxiliary structure comprises a dielectric material, a semiconductor material, a conductor material or a stack of any two of above.

3. The self-emissive element as claimed in claim 1, wherein the first pad and the second pad are respectively located on different sides of the light-emitting diode.

4. The self-emissive element as claimed in claim 1, wherein the first pad and the second pad are located on a same side of the light-emitting diode.

5. The self-emissive element as claimed in claim 1, wherein the auxiliary structure further includes a second anchor portion, wherein the first anchor portion and the second anchor portion are respectively located at different sides of the light-emitting diode, and the second anchor portion and the protection portion are respectively located at different sides of the light-emitting diode.

6. A manufacturing method of a light-emitting device, comprising:
   providing a pixel circuit substrate, wherein the pixel circuit substrate comprises a plurality of driving structures, each of the driving structures including a first electrode and a second electrode;
   performing a first transposition process to provide a first light-emitting element on one of the driving structures, wherein the first light-emitting element is the self-emissive element as described in claim 1;
   electrically connecting a first pad of the first light-emitting element to the first electrode of the one of the driving structures;
   electrically connecting a second pad of the first light-emitting element to the second electrode of the one of the driving structures; and
   performing a second transposition process to provide a second light-emitting element on another of the driving structures, wherein the second light-emitting element is the self-emissive element as described in claim 1.

7. The manufacturing method as claimed in claim 6, wherein each of the driving structures further includes a first auxiliary electrode and a second auxiliary electrode, wherein the first auxiliary electrode is structurally connected with the first electrode and has a same electric potential with the first electrode, and the second auxiliary electrode is structurally connected with the second electrode and has a same electric potential with the second electrode.

8. The manufacturing method as claimed in claim 6, wherein each of the driving structures further includes a first auxiliary electrode and a second auxiliary electrode, wherein the first auxiliary electrode is structurally separated from the first electrode and has a same electric potential with the first electrode, and the second auxiliary electrode is structurally separated from the second electrode and has a same electric potential with the second electrode.

9. The manufacturing method as claimed in claim 6, further comprises:
   forming a first conductive layer on the first light-emitting element to electrically connect the second pad of the first light-emitting element and the second electrode of the one of the driving structures.

10. The manufacturing method as claimed in claim 9, wherein each of the driving structures further comprises a first auxiliary electrode, and the first auxiliary electrode of the one of the driving structures has a same electric potential with the first electrode of the one of the driving structures.

11. The manufacturing method as claimed in claim 10, wherein a protection portion of the first light-emitting element overlaps the first auxiliary electrode in the vertical direction.

12. The manufacturing method as claimed in claim 10, further comprises:
   electrically connecting a first pad of the second light-emitting element to the first auxiliary electrode of the another of the driving structures; and
   forming a second conductive layer on the second light-emitting element to electrically connect a second pad of the second light-emitting element to the second electrode of the another of the driving structures.

13. The manufacturing method as claimed in claim 6, further comprises
   forming an adhesive layer on the pixel circuit substrate;
   forming a first conductive layer on the first light-emitting element to electrically connect the first pad of the first light-emitting element to the first electrode of the one of the driving structures; and
   forming a second conductive layer on the first light-emitting element to electrically connect the second pad of the first light-emitting element and the second electrode of the one of the driving structures.

14. The manufacturing method as claimed in claim 13, wherein a cover portion of an auxiliary structure of the first light-emitting element and a protection portion overlap the adhesive layer in the vertical direction.

15. The manufacturing method as claimed in claim 6, wherein the first pad of the first light-emitting element and the second pad of the first light-emitting element face the pixel circuit substrate.

16. The manufacturing method as claimed in claim 15, wherein each of the driving structures further includes a first auxiliary electrode and a second auxiliary electrode, wherein the first auxiliary electrode of the one of the driving structures has a same electric potential with the first electrode of the one of the driving structures, and the second auxiliary electrode of the one of the driving structures has a same electric potential with the second electrode of the one of the driving structures.

17. The manufacturing method as claimed in claim 16, wherein a protection portion of the first light-emitting element is overlapped with the first auxiliary electrode of the one of the driving structures and the second auxiliary electrode of the one of the driving structures.

18. The self-emissive element as claimed in claim 1, wherein an orthographic projection area of the first anchor portion in the vertical direction is smaller than the orthographic projection area of the protection portion in the vertical direction.

19. A light-emitting device, comprising:
a pixel circuit substrate, comprising:
 a substrate; and
 at least two of driving structures, located on the substrate, wherein each of the at least two of driving structures comprises:
  a first electrode;
  a second electrode; and
  a first auxiliary electrode, wherein the second electrode and the first electrode are separated from each other, and the second electrode and the first auxiliary electrode are separated from each other; and
at least two of self-emissive elements comprising a first light-emitting element and a second light-emitting element, disposed on the pixel circuit substrate, wherein each of the first light-emitting element and the second light-emitting element comprises:
a light-emitting diode comprising:
 a first type semiconductor;
 a second type semiconductor overlapped with the first type semiconductor in a vertical direction perpendicular to a bottom surface of the first type semiconductor;
 an active layer disposed between the first type semiconductor and the second type semiconductor;
 a first pad connecting with the first type semiconductor; and
 a second pad connecting with the second type semiconductor; and
an auxiliary structure, including:
 a cover portion overlapped with the light-emitting diodes in the vertical direction;
 a protection portion not overlapped with the light-emitting diode in the vertical direction, wherein an orthographic projection area of the protection portion in the vertical direction is greater than or equal to an orthographic projection area of the light emitting diode in the vertical direction; and
 a first anchor portion, wherein the first anchor portion and the protection portion are respectively located at different sides of the light-emitting diode;
 wherein a first pad of the first light-emitting element electrically connects a first electrode of one of the at least two of driving structures, and a protection portion of the first light-emitting element covers a first auxiliary electrode of the one of the at least two of driving structures.

20. The light-emitting device as claimed in claim 19, wherein a first pad the second light-emitting element electrically connects a first auxiliary electrode of another of the at least two of driving structures, wherein a protection portion of the second light-emitting element doesn't cover a first electrode of the another of the at least two of driving structures.

21. The light-emitting device as claimed in claim 20, further comprises:
a plurality of conductive layers comprising a first conductive layer and a second conductive layer, disposed on the pixel circuit substrate and the at least two of self-emissive elements, wherein the first conductive layer electrically connects a second pad of the first light-emitting element and a second electrode of the one of the at least two of driving structures, and the second conductive layer electrically connects a second pad of the second light-emitting element to a second electrode of the another of the at least two of driving structures.

22. The light-emitting device as claimed in claim 19, wherein each of the at least two of driving structures further comprises a second auxiliary electrode is separated from the first electrode, and the second auxiliary electrode is separated from the first auxiliary electrode.

23. The light-emitting device as claimed in claim 19, wherein a second pad of the first light-emitting element electrically connects a second electrode of one of the at least two of driving structures, and the protection portion of the first light-emitting element covers a second auxiliary electrode of the one of the at least two of driving structures.

24. The light-emitting device as claimed in claim 19, wherein a first pad of the second light-emitting element electrically connects to a first auxiliary electrode of another of the at least two of driving structures, a second pad of the second light-emitting element electrically connects to a second auxiliary electrode of the another of the at least two of driving structures, wherein a protection portion of the second light-emitting element doesn't cover a first electrode and a second electrode of the another of the at least two of driving structures.

25. The self-emissive element as claimed in claim 1, wherein the cover portion and the first anchor portion are formed with a same material.

26. The self-emissive element as claimed in claim 1, wherein the auxiliary structure is a layered structure in contact with a top surface of the light-emitting diode, a first side of the light-emitting diode, and a second side of the light-emitting diode, wherein the first side of the light-emitting diode and the second side of the light-emitting diode are located at different sides of the top surface of the light-emitting diode, and wherein the protection portion is located on the first side of the light-emitting diode, and the first anchor portion is located on the second side of the light emitting diode.

* * * * *